United States Patent
Matsuura et al.

(10) Patent No.: US 7,251,462 B2
(45) Date of Patent: Jul. 31, 2007

(54) MODULATION CIRCUIT DEVICE, MODULATION METHOD AND RADIO COMMUNICATION DEVICE

(75) Inventors: Toru Matsuura, Osaka (JP); Hisashi Adachi, Osaka (JP); Masaharu Udagawa, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 436 days.

(21) Appl. No.: 10/886,371

(22) Filed: Jul. 7, 2004

(65) Prior Publication Data

US 2005/0008093 A1 Jan. 13, 2005

(30) Foreign Application Priority Data

Jul. 8, 2003 (JP) .............................. 2003-271794

(51) Int. Cl.
*H04B 1/02* (2006.01)
*H03F 3/38* (2006.01)
*H03F 1/26* (2006.01)

(52) U.S. Cl. ...................... 455/108; 455/110; 455/102; 330/10; 330/149

(58) Field of Classification Search ................ 455/108, 455/110; 330/10, 149, 124 R
See application file for complete search history.

(56) References Cited

U.S. PATENT DOCUMENTS

| | | | |
|---|---|---|---|
| 5,142,240 A * | 8/1992 | Isota et al. ................... | 330/149 |
| 5,751,705 A | 5/1998 | Sato | |
| 5,828,206 A * | 10/1998 | Hosono et al. .............. | 323/273 |
| 6,201,441 B1 * | 3/2001 | Suematsu et al. ............. | 330/51 |
| 6,242,975 B1 * | 6/2001 | Eidson et al. ........... | 330/124 R |
| 6,404,823 B1 * | 6/2002 | Grange et al. .............. | 375/297 |
| 6,411,655 B1 * | 6/2002 | Holden et al. ............... | 375/269 |
| 6,445,249 B1 * | 9/2002 | Khan et al. .................. | 330/149 |
| 6,714,071 B1 * | 3/2004 | Page ........................... | 330/136 |
| 6,844,776 B2 * | 1/2005 | Schell et al. ................... | 330/10 |
| 7,023,897 B2 * | 4/2006 | Kurihara ...................... | 375/130 |
| 7,058,373 B2 * | 6/2006 | Grigore ................... | 455/127.1 |
| 7,091,772 B2 * | 8/2006 | Friedel et al. ................. | 330/10 |
| 7,092,683 B2 * | 8/2006 | Tanaka et al. ............... | 455/108 |

FOREIGN PATENT DOCUMENTS

JP 9-18451 1/1997

OTHER PUBLICATIONS

D. Rudolph, "Out-of-Band Emissions of Digital Transmissions Using Kahn EER Technique", IEEE Transactions on Microwave Theory and Techniques, vol. 50, No. 8, pp. 1979-1983, Aug. 2002.

* cited by examiner

*Primary Examiner*—Duc Nguyen
(74) *Attorney, Agent, or Firm*—RatnerPrestia

(57) ABSTRACT

The amplitude modulator comprises: an angle modulator for angle-modulating a phase signal to be inputted; a waveform shaping means in which, (1) when the magnitude of an amplitude signal to be inputted becomes smaller than a first prescribed value, a waveform of the amplitude signal is shaped so that the magnitude of the amplitude signal of the portion which becomes small becomes the first prescribed value; and/or (2) the waveform shaping means in which, when the magnitude of the amplitude signal to be inputted becomes larger than the second prescribed value which is larger than the first prescribed value, the waveform of the amplitude signal is shaped so that the magnitude of the amplitude signal of the portion which becomes larger becomes the second prescribed value; and an amplitude modulator for amplitude modulating the signal of the output of the angle modulator by the signal of the output of the waveform shaping means.

21 Claims, 29 Drawing Sheets

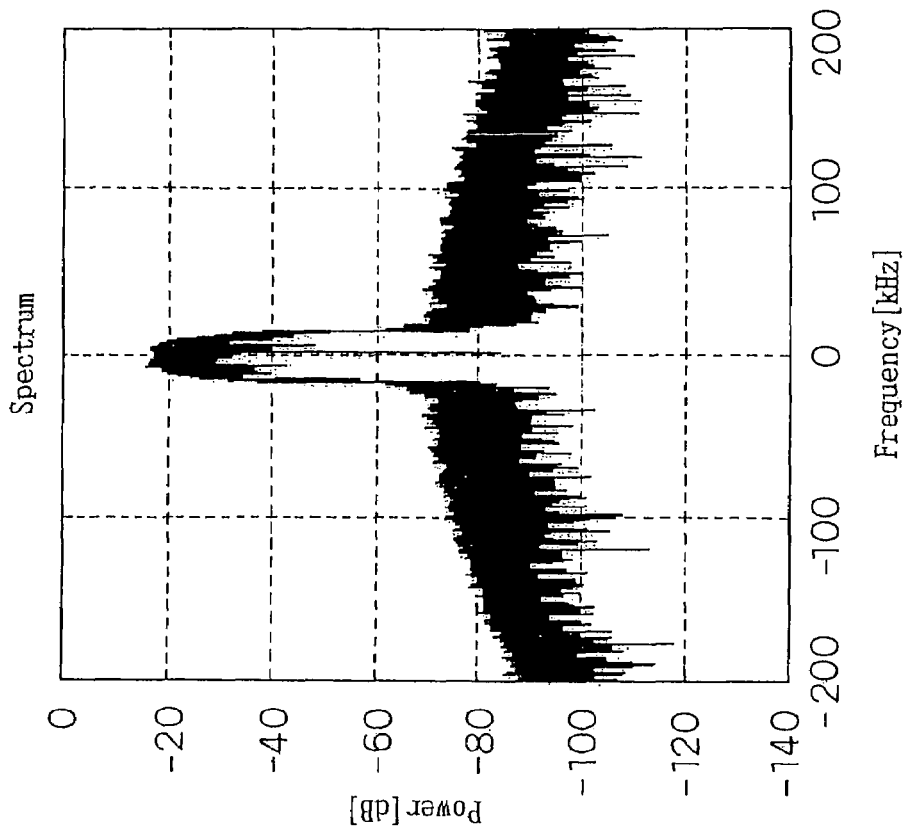
Fig. 12(a) Original Spectrum — No limit on amplitude control
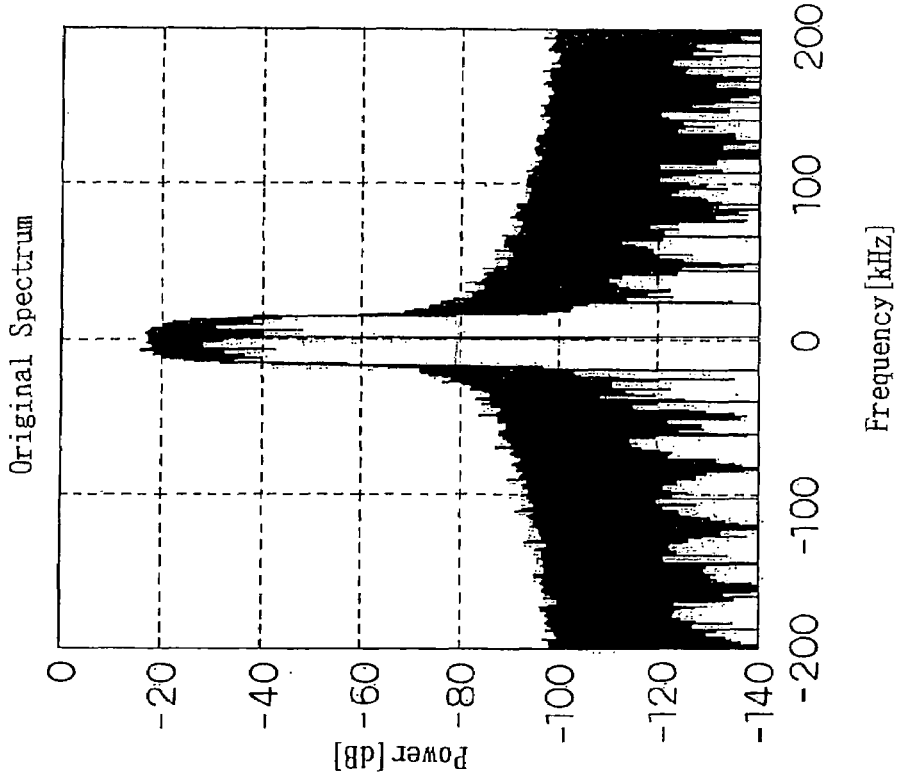
Fig. 12(b) Spectrum — Amplitude controlled at −8dB

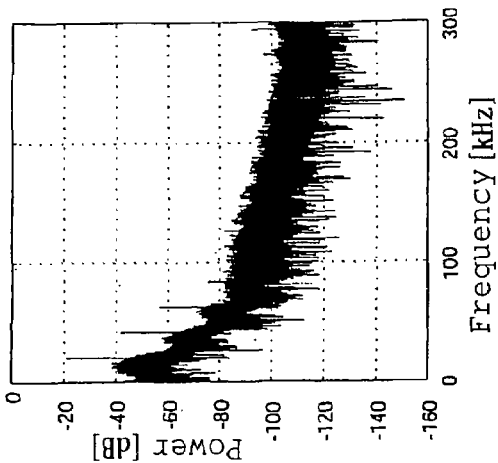
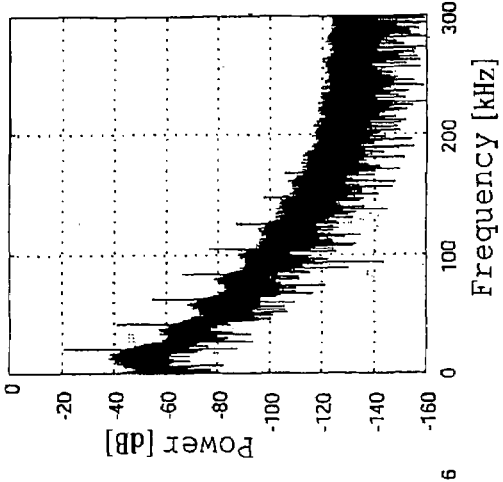
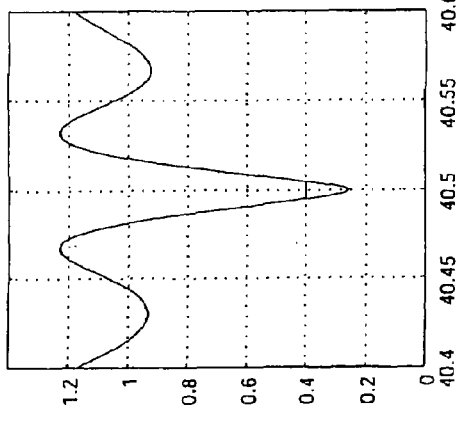
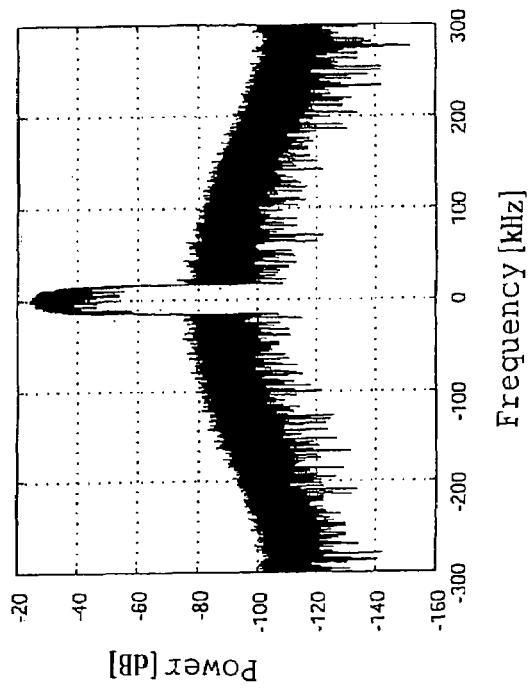

MODULATION CIRCUIT DEVICE, MODULATION METHOD AND RADIO COMMUNICATION DEVICE

BACKGROUND OF THE INVENTION

1. Field of the Invention

The present invention relates to a modulation circuit device used for a transmission circuit device such as a mobile phone and the like, and more in particular, it relates to a modulation circuit device for polar-modulating an input signal, a modulation method and a radio communication device using the same.

2. Related Art of the Invention

A quadrature modulator has been widely used for a modulation circuit device used for a transmission circuit device, which is used for the terminal of a mobile phone and a base station. In recent years, however, a polar modulation has been highlighted, which is a modulation form allowing data to be carried by a polar coordinate system (phase and amplitude) (for example, Japanese Patent Laid-Open No. 09-18451). The disclosure of Japanese Patent Laid-Open No. 09-18451 is incorporated herein by reference in its entirety.

In FIG. 31 is shown a conventional modulation circuit device 101 which performs such a polar modulation.

The modulation circuit device 101 consists of an angle modulator 102, a voltage control circuit 103, and an amplitude modulator 104.

The angle modulator 102 is a circuit which angle-modulates a carrier wave by a phase signal 106 inputted from a second input terminal 109.

The voltage control circuit 103 is used for supplying a stable voltage to the amplitude modulator 104, and is a circuit to amplify an amplitude signal 105 inputted from a first input terminal 108.

The amplitude modulator 104 is a circuit to amplitude-modulate the signal from the output of the angle modulator 102 by the signal of the output of the voltage control circuit 103.

In FIG. 8 there is shown an example of the amplitude modulator 104.

The amplitude modulator 104 consists of a bipolar transistor 111, a matching circuit 112, a bias circuit 113, and a matching circuit 114.

That is, one end of the matching circuit 112 is connected to the base of the bipolar transistor, and the other end of the matching circuit 112 is connected to the output of the angle modulator 102. Further, an emitter of the bipolar transistor 111 is grounded. Further, the one end of the bias circuit 113 and the one end of the matching circuit 114 are connected to the collector of the bipolar transistor 111. The other end of the bias circuit 111 is connected to the output of the voltage control circuit 103, and the other end of the matching circuit 114 is connected to an output terminal 110. Note that a bias circuit and a power supply connected to the base side of the bipolar transistor 111 are omitted from the illustration.

Next, the operation of a conventional modulation circuit device 101 will be described.

An amplitude signal 105 and a phase signal 106 from the data inputted to a data generator by an unillustrated data generator are generated. The amplitude signal 105 generated by the data generator is inputted to the firs input terminal 108. Further, the phase signal 106 generated by the data generator is inputted to the second input terminal 109.

On the other hand, a power supply voltage is supplied to the voltage control circuit 103 from a power supply terminal 107.

The amplitude signal 105 inputted to the first input terminal 108 is then inputted to the voltage control circuit 103 and it is amplified by the voltage control circuit 103, and after that, is outputted to the amplitude modulator 104. By using the voltage control circuit 103, a stable voltage can be supplied to the amplitude modulator 104. That is, a voltage change due to the change of an input impedance and the like of the amplitude modulator 104 can be avoided.

Further, the phase signal 106 inputted to the second input terminal 109 is inputted to the angle modulator 102. The angle modulator 102 angle-modulates the carrier wave by the phase signal 106 to be inputted. The signal angle-modulated become a signal of a constant envelope. The signal angle-modulated by the angle modulator 102 is inputted to the amplitude modulator 104.

The amplitude modulator 104 amplitude-modulates the signal angle-modulated by the angle modulator 102 by the signal of the output of the voltage control circuit 103. That is, the signal from the output of the voltage control circuit 103 is inputted to the collector of the bipolar transistor 111, which constitutes the amplitude modulator 104, through the bias circuit 113. Further, the signal of the output of the angle modulator 102 is inputted to the base of the bipolar transistor 111 through the matching circuit 112. An output signal is outputted from the collector of the bipolar transistor 111 through the matching circuit.

That is, by controlling the collector voltage of the bipolar transistor 111 by the signal of the output of the voltage control circuit 103, the amplitude modulator 104 outputs a signal treated with both of angle modulation and amplitude modulation. In this way, the signal of the output of the amplitude modulator 104 becomes a changing signal of the envelope. The signal of the output of the amplitude modulator 104 is outputted from the output terminal 110 as a polar modulated signal.

Note that, as the angle modulator 102, a phase modulator to perform phase modulation and the frequency modulator to perform frequency modulation can be used.

In FIG. 9(a) is shown a relationship between the second power of the supply voltage of the voltage control circuit 103 to the amplitude modulator 104 and the output power of the amplitude modulator 104. Further, in FIG. 9(b) is shown a relationship between the second power of the supply voltage from the voltage control circuit 103 to the amplitude modulator 104 and the phase shift of the amplitude modulator 104.

In FIG. 9(a), the abscissa shows the second power of the voltage supplied to the collector of the bipolar transistor 111 through the bias circuit 113, and the longitudinal axis shows the output voltage of the signal outputted from the matching circuit 114.

Further, in FIG. 9(b), the abscissa shows the second power of the voltage supplied to the collector of the bipolar transistor 111 through the bias circuit 113, and the longitudinal axis shows the phase shift of the signal outputted from the matching circuit 114.

In FIG. 9(a), in the range shown as a linear region, the relationship between the second power of the supply voltage and the output becomes a linear relationship. However, when the second power of the supply voltage becomes smaller than the linear range shown in FIG. 9(a), the relationship between the second power of the supply voltage and the output power becomes a non-linear relationship. Further, when the second power of the supply voltage becomes larger than the linear region shown in FIG. 9(a), the relationship between the second power of the supply voltage and the output power becomes the non-linear relationship.

Further, in FIG. 9(b), in the range shown as a flat region, the phase shift is constant for the second power of the supply voltage. However, in the case where the second power of the supply voltage is smaller than the flat region shown in FIG. 9(b), when the second power of the supply voltage changes, the phase shift also changes. Further, in the case where the second power of the supply voltage is larger than the flat region shown in FIG. 9(b), when the second power of the supply voltage changes, the phase shift also changes.

The reason why such a relationship of FIG. 9(a) is obtained can be considered as follows. That is, the voltage from the output of the voltage control circuit 103 is applied to the collector of the bipolar transistor 111 of the amplitude modulator 104, and when this voltage becomes low, the voltage of the collector of the bipolar transistor 111 comes close to the voltage of the base of the bipolar transistor 111. Consequently, the linearity disappears. In other words, when the supply voltage becomes small, as shown in FIG. 9(a), the relationship between the second power of the supply voltage and the output power becomes a non-linear relationship. Further, when the voltage of the collector of the bipolar transistor 111 becomes high, the linearity disappears due to saturation and heat dissipation. Consequently, when the supply voltage becomes high, as shown in FIG. 9(a), the relationship between the second power of the supply voltage and the output voltage becomes the non-linear relationship.

Meanwhile, as for the signal from the output of the amplitude modulator used in the amplitude circuit device to perform the polar modulation, a signal sufficiently deeply amplitude-modulated is desired. In order to sufficiently deeply amplitude-modulate, it is necessary to sufficiently deeply enlarge a dynamic range of the supply voltage supplied from the voltage control circuit. However, when the dynamic range is enlarged, the second power of the supply voltage is forced out from the range of the linear region of FIG. 9(a) and the flat region of FIG. 9(b), and the signal outputted from the amplitude modulator ends up being distorted.

Consequently, in order to obtain the signal sufficiently deeply amplitude-modulated by such an amplitude-modulator, it is necessary to use a transistor which is sufficiently wide in the range shown as the linear region of FIG. 9(a). Further, it is necessary to use a transistor which is sufficiently wide in the range shown as the flat region of FIG. 9(b). This is difficult to realize by a single transistor, and moreover, in the case where this is realized by using a plurality of transistors, it becomes complicated to control these transistors, and moreover, in the case where distortion correction is performed by a table, the amount of memory required becomes large.

That is, in the case where the transistor used in the amplitude modulator of the modulator for performing the conventional polar modulation is a transistor not having the linearity in a wide range, there is a problem in that a signal sufficiently deeply amplitude-modulated cannot be obtained.

Further, when an attempt is made to obtain the signal sufficiently deeply amplitude-modulated by the conventional modulator for performing the polar modulation, a transistor having the linearity in a wide range is required. This is difficult to realize by a single transistor, and moreover, in the case where this is realized by using a plurality of transistors, it becomes complicated to control these transistors, and moreover, in the case where distortion correction is performed by a table, there is a problem in that the amount of memory required becomes large.

Considering the above-described problems, it is an object of the present invention to provide a modulation circuit device, a modulation method and a radio communication device, which can obtain a desired signal even when the transistor used as the amplitude modulator of the modulator for performing a polar modulation is a transistor not having a linearity in the wide range.

Further, considering the above-described problems, it is an object of the present invention to provide a modulation circuit device, a modulation method and a radio communication device, which can obtain a desired signal by using a single transistor by the modulator for performing a polar modulation or without becoming complicated when a plurality of transistor is used.

SUMMARY OF THE INVENTION

To solve the problems as described above, the $1^{st}$ aspect of the present invention is a modulation circuit device, comprising:

an angle modulator of angle-modulating a phase signal to be inputted;

waveform shaping means in which, (1) when the magnitude of an amplitude signal to be inputted becomes smaller than a first prescribed value, a waveform of said amplitude signal is shaped so that the magnitude of said amplitude signal of the portion which becomes small becomes said first prescribed value, and/or (2) when the magnitude of said amplitude signal to be inputted becomes larger than said second prescribed value which is larger than said first prescribed value, the waveform of said amplitude signal is shaped so that the magnitude of said amplitude signal of the portion which becomes large becomes said second prescribed value; and an amplitude modulator of amplitude-modulating the signal from the output of said angle modulator by the signal of the output of said waveform shaping means.

The $2^{nd}$ aspect of the present invention is a modulation circuit device, comprising:

an angle modulator of angle-modulating a phase signal to be inputted;

a waveform shaping means in which, (1) when the magnitude of an amplitude signal to be inputted becomes smaller than a first prescribed value, a waveform of said amplitude signal is shaped so that the magnitude of said amplitude signal of the portion which becomes small becomes said first prescribed value, and/or (2) when the magnitude of said amplitude signal to be inputted becomes larger than said second prescribed value which is larger than said first prescribed value, the waveform of said amplitude signal is shaped so that the magnitude of said amplitude signal of the portion which becomes larger becomes said second prescribed value;

a direct current voltage supply circuit of supplying a direct current voltage;

a first amplitude modulator which operates on either of the operation modes of a first operation mode for amplifying the signal from the output of said angle modulator and a second operation mode for amplitude modulating the signal of the output of said angle modulator by the signal of the output of said waveform shaping means; and a second amplitude modulator which operates on either of the operation modes of a first operation mode for amplifying the output of said first amplitude modulator and a second operation mode for amplitude-modulating the signal of the output of said first amplitude modulator by the signal of the output of said waveform shaping means;

wherein, when an output is made larger than a prescribed value by an output power, said first amplitude modulator is operated on said first operation mode with the signal from the output of said direct current voltage supply circuit controlled to be inputted, and said second amplitude modulator is operated on the second operation mode with the signal of the output of said waveform shaping means controlled to be inputted, wherein, when an output is made by an output power smaller than a prescribed value, said first amplitude modulator is operated on said second operation mode with the signal from the output of said waveform shaping means controlled to be inputted, and said second amplitude modulator is operated on the first operation mode with the signal of the output of said direct current voltage supply circuit controlled to be inputted.

The $3^{rd}$ aspect of the present invention is a modulation circuit device, comprising:

an angle modulator of angle-modulating a phase signal to be inputted;

waveform shaping means in which, (1) when the magnitude of an amplitude signal to be inputted becomes smaller than a first prescribed value, a waveform of said amplitude signal is shaped so that the magnitude of said amplitude signal of the portion which becomes small becomes said first prescribed value, and/or (2) when the magnitude of said amplitude signal to be inputted becomes larger than said first prescribed value which is larger than said second prescribed value, the waveform of said amplitude signal is shaped so that the magnitude of said amplitude signal of the portion which becomes larger becomes said second prescribed threshold value;

a direct current voltage supply circuit of supplying a direct current voltage;

a first amplitude modulator which operates on either of the operation modes of a first operation mode for amplifying the signal from the output of said angle modulator and a second operation mode for amplitude-modulating the signal of the output of said angle modulator by the signal of the output of said waveform shaping means; and a second amplitude modulator of amplitude-modulating the signal of the output of said first amplitude modulator by the signal of the output of said waveform shaping means;

wherein, when an output is made larger than a prescribed value by an output power, said first amplitude modulator is operated on said first operation mode with the signal from the output of said direct current voltage supply circuit controlled to be inputted, and said second amplitude-modulator amplitude modulates the signal of the output of said first amplitude modulator by the signal of the output of said waveform shaping means with the signal of the output of said waveform shaping means controlled to be inputted, and the signal of the output of said second amplitude modulator is outputted outside, wherein, when an output is made smaller than a prescribed value by an output power, said first amplitude modulator is operated on the second operation mode with the signal from the output of said waveform shaping means controlled to be inputted, and the signal of the output of said first amplitude modulator is outputted outside.

The $4^{th}$ aspect of the present invention is the modulation circuit device according to the $2^{nd}$ or the $3^{rd}$ aspect of the present invention, wherein said voltage control circuit changes said direct current according the magnitude of an output power.

The $5^{th}$ aspect of the present invention is the modulation circuit device according to any one of the $1^{st}$ to the $3^{rd}$ aspects of the present invention, wherein said waveform shaping means comprises:

amplitude control means of shaping the waveform of said amplitude signal; and the voltage control circuit of generating an output signal based on the signal of the output of said amplitude control means.

The $6^{th}$ aspect of the present invention is the modulation circuit device according to the $5^{th}$ aspect of the present invention, wherein a diode is used for said amplitude control means.

The $7^{th}$ aspect of the present invention is the modulation circuit device according to the $5^{th}$ aspect of the present invention, wherein a series regulator is used for said voltage control circuit.

The $8^{th}$ aspect of the present invention is the modulation circuit device according to the $5^{th}$ aspect of the present invention, wherein a switching regulator is used for said voltage control circuit.

The $9^{th}$ aspect of the present invention is the modulation circuit device according to any one of the $1^{st}$ to the $3^{rd}$ aspects of the present invention, wherein said waveform shaping means comprises:

the voltage control circuit of amplifying said amplitude signal to be inputted; and amplitude control means of shaping the waveform of the signal of the output of said voltage control circuit.

The $10^{th}$ aspect of the present invention is the modulation circuit device according to the $9^{th}$ aspect of the present invention, wherein a diode is used for said amplitude control means.

The $11^{th}$ aspect of the present invention is the modulation circuit device according to the $9^{th}$ aspect of the present invention, wherein a series regulator is used for said voltage control circuit.

The $12^{th}$ aspect of the present invention is the modulation circuit device according to the $9^{th}$ aspect of the present invention, wherein a switching regulator is used for said voltage control circuit.

The $13^{th}$ aspect of the present invention is the modulation circuit device according to the $5^{th}$ aspect of the present invention, wherein said voltage control circuit serves as said amplitude control means, wherein said voltage control circuit comprises a function to shape the waveform of said amplitude signal so as to meet the characteristic of said amplitude modulator.

The $14^{th}$ aspect of the present invention is the modulation circuit device according to the $9^{th}$ aspect of the present invention, wherein said voltage control circuit serves as said amplitude control means, wherein said voltage control circuit comprises a function to shape the waveform of said amplitude signal so as to meet the characteristic of said amplitude modulator.

The $15^{th}$ aspect of the present invention is the modulation circuit device according to any one of the $1^{st}$ to the $3^{rd}$ aspects of the present invention, (1) wherein the waveform shaping means shapes to round out an intersecting point with a portion which is cut and shaped by said first prescribed value and a portion which is not cut nor shaped by said first prescribed value from among said amplitude signals to be inputted, (2) and/or wherein the waveform shaping means and shapes to round out an intersecting point with a portion which is cut and shaped by said second prescribed value and a portion which is not cut nor shaped by said second prescribed value from among said amplitude signals to be inputted.

The 16$^{th}$ aspect of the present invention is the modulation circuit device according to the 15$^{th}$ aspect of the present invention, wherein (1) from among the magnitude of said amplitude signals to be inputted, said waveform shaping means makes said intersecting point round and shaped so that the first order differential coefficient and the second order differential coefficient involved with the magnitude of said amplitude signals to be inputted of the magnitude of said signal from the output of said waveform shaping means corresponding to the portion made round and shaped of the side relating to said first prescribed value does not become negative, respectively, and/or wherein (2), from among the magnitude of said amplitude signals to be inputted, said waveform shaping means makes said intersecting point round and shaped, so that the first order differential coefficient involved with the magnitude of said amplitude signals to be inputted of the magnitude of said signal of the output of said waveform shaping means corresponding to the portion to be made round and shaped relating to said second prescribed value does not become negative nor the second order differential coefficient becomes positive.

The 17$^{th}$ aspect of the present invention is the modulation circuit device according to the 15$^{th}$ aspect of the present invention, wherein said waveform shaping means shapes the waveform of said amplitude signal to be inputted by using a table which allows the input signal to correspond to the output signal.

The 18$^{th}$ aspect of the present invention is a modulation method, comprising:

an angle modulation step of angle modulating a phase signal to be inputted by an angle modulator;

a waveform shaping step of shaping a waveform of the amplitude signal by the waveform shaping means in which, (1) when the magnitude of said amplitude signal to be inputted becomes smaller than said first prescribed value, the magnitude of said amplitude signal of the portion which becomes small becomes said first prescribed value, (2) and/or when the magnitude of said amplitude signal to be inputted becomes larger than a second prescribed value which is larger than a first prescribed value, the magnitude of said amplitude signal of the portion which becomes large becomes said second prescribed value; and an amplitude modulation step of amplitude-modulating the signal of the output of said angle modulator by the signal of the output of said waveform shaping means.

The 19$^{th}$ aspect of the present invention is a modulation method, comprising:

an angle modulation step of angle modulating a phase signal to be inputted by an angle modulator, a waveform shaping step, in which (1), when the magnitude of the amplitude signal to be inputted becomes smaller than the first prescribed value, the waveform of said amplitude signal is shaped so that the magnitude of said amplitude signal of the portion which becomes small becomes said first prescribed value, (2) and/or when the magnitude of said amplitude signal to be inputted becomes larger than a second prescribed value which is larger than a first prescribed value, the waveform of the said amplitude signal is shaped so that the magnitude of said amplitude signal of the portion which becomes large becomes said second prescribed value;

a direct current voltage supply step of supplying a direct current voltage by a direct current voltage supply circuit;

a first amplitude modulation step which operates a first amplitude modulator on either of the operation modes of a first operation mode for amplifying the signal from the output of said angle modulator or a second operation mode for amplitude modulating the signal of the output of said angle modulator by the signal of the output of said waveform shaping means; and a second amplitude modulation step which operates a second amplitude modulator on either of the operation modes of a first operation mode for amplifying the signal from the output of said first amplitude modulator or a second operation mode for amplitude modulating the signal of the output of said first amplitude modulator by the signal of the output of said waveform shaping means;

wherein, when an output is made larger than a prescribed value by an output power, said first amplitude modulator is operated on said first operation mode with the signal from the output of said direct current voltage supply circuit controlled to be inputted, and said second amplitude modulator is operated on the second operation mode with the signal of the output of said waveform shaping means controlled to be inputted, wherein, when an output is made smaller than a prescribed value by an output power, said first amplitude modulator is operated on said second operation mode with the signal from the output of said waveform shaping means controlled to be inputted, and said second amplitude modulator is operated on the first operation mode with the signal of the output of said direct current voltage supply circuit controlled to be inputted.

The 20$^{th}$ aspect of the present invention is a modulation method, comprising:

an angle modulation step of angle-modulating a phase signal to be inputted by an angle modulator;

a waveform shaping step, in which, (1) when the magnitude of said amplitude signal to be inputted becomes smaller than said first prescribed value, the waveform of said amplitude signal is shaped by the waveform shaping means so that the magnitude of said amplitude signal of the portion which becomes small becomes said first prescribed value, (2) and/or, when the magnitude of said amplitude signal to be inputted becomes larger than a second prescribed value which is larger than a first prescribed value, the waveform of said amplitude signal is shaped shaping so that said amplitude signal of the portion which becomes large becomes said second prescribed value;

a direct current voltage supply step of supplying a direct current voltage by a direct current supply circuit;

a first amplitude modulation step which operates a first amplitude modulator on either of the operation modes of a first operation mode for amplifying the signal from the output of said angle modulator or a second operation mode for amplitude modulating the signal of the output of said waveform shaping means by the signal of the output of said waveform shaping means; and a second amplitude modulation step which causes a second amplitude modulator to amplitude modulate the signal of the output of said first amplitude modulator by the signal of the output of said waveform shaping means, wherein, when an output is made larger than a prescribed value by an output power, said first amplitude modulator is operated on said first operation mode with the signal from the output of said direct current voltage supply circuit controlled to be inputted, and said second amplitude modulator is controlled to be inputted with the signal of the output of said waveform shaping means, so that the signal from the output of said first amplitude modulator is amplitude-modulated by the signal of the output of said waveform shaping means, and the signal of the output of said second amplitude modulator is outputted outside, wherein, when an output is made smaller than a prescribed value by an output power, said first amplitude modulator is operated on said second operation mode with the signal from the output of said waveform shaping means controlled to be inputted, and the signal of the output of said first amplitude modulator is outputted outside.

The 21st aspect of the present invention is the modulation method according to any one of the 18th to the 20th aspects of the present invention, (1) wherein the waveform shaping step makes round and shapes an intersecting point with a portion which is cut and shaped by said first prescribed value and a portion which is not cut nor shaped by said first prescribed value from among said amplitude signals to be inputted, (2) and/or wherein the waveform shaping step makes round and shapes an intersecting point with a portion which is cut and shaped by said second prescribed value and a portion which is not cut nor shaped by said second prescribed value from among said amplitude signals to be inputted.

The 22nd aspect of the present invention is the modulation method according to the 21st aspect of the present invention, wherein (1) from among the magnitude of said amplitude signals to be inputted, said waveform shaping step makes said intersecting point round and shaped so that the first order differential coefficient and the second order differential coefficient involved with the magnitude of said amplitude signals to be inputted of the magnitude of said signal from the output of said waveform shaping means corresponding to the portion made round and shaped of the side related to said first prescribed value does not become negative, respectively, and/or wherein (2), from the magnitude of among said amplitude signals to be inputted, said waveform shaping means makes said intersecting point round and shaped, so that the first order differential coefficient involved with the magnitude of said amplitude signals to be inputted of the magnitude of said signal of the output of said waveform shaping means corresponding to the portion to be made round and shaped related to said second prescribed value does not become negative and the second order differential coefficient does not become positive.

The 23rd aspect of the present invention is a radio communication device, comprising:

a transmission circuit of outputting a transmission signal; and a receiving circuit of inputting a receiving signal, wherein the modulation circuit device according to any one of the 1st to the 3rd aspects of the present invention is used for said transmission circuit.

BRIEF DESCRIPTION OF THE DRAWINGS

FIG. 12(a) is a view showing a power spectrum of an output signal of the modulation circuit device at the time when the amplitude control of the amplitude signal is not performed;

FIG. 12(b) is a view showing the power spectrum of the output signal of the modulation circuit device in the first embodiment of the present invention;

FIG. 20(a) is a view showing the waveform of the amplitude signal before amplitude control and after amplitude control by the amplitude control means in case of using the amplitude control means having a characteristic of FIG. 17;

FIG. 20(b) is a view showing a power spectrum of the amplitude signal before it is inputted to the amplitude control means in case of using the amplitude control means having a characteristic of FIG. 17;

FIG. 20(c) is a view showing the power spectrum of the amplitude signal outputted and waveform-controlled from the amplitude control means in case of using the amplitude control means having a characteristic of FIG. 17;

FIG. 20(d) is a view showing the power spectrum of the output signal from the output terminal of the modulation circuit device of the first embodiment in case of using the amplitude control means having a characteristic of FIG. 17;

DESCRIPTION OF SYMBOLS

Figure 1:
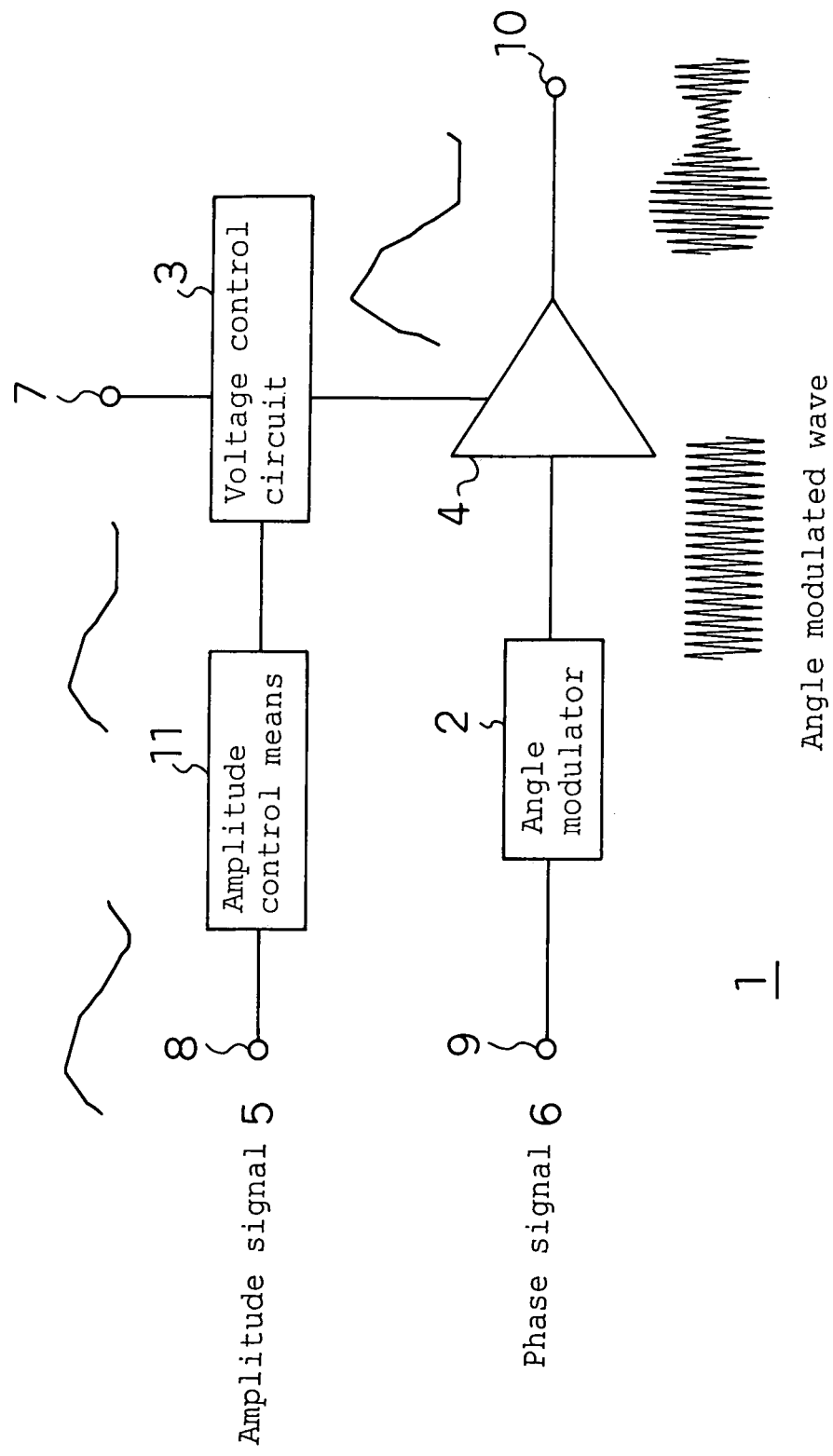
FIG. 1 is a view showing a structure of a modulation circuit device of a first embodiment of the present invention.

1 Modulation circuit device
2 Angle modulator
3 Voltage control circuit
4 Amplitude modulator
5 Amplitude signal
6 Phase signal
7 Power supply
8 First input terminal
9 Second input terminal
10 Output terminal
11 Amplitude control means
12 Modulation circuit device
13 First amplitude modulator
14 Second amplitude modulator
15 Switch
16 First voltage control circuit
17 Second voltage control circuit
18 Modulation circuit device
19 Modulation circuit device
42 Amplitude control means

PREFERRED EMBODIMENTS OF THE INVENTION

Embodiments of the present invention will be described below with reference to the drawings.

First Embodiment

First, the first embodiment will be described.

FIG. 1 shows a modulation circuit device 1 of the first embodiment.

The modulation circuit device 1 of the first embodiment is, similarly to the conventional art, used for a transmitting circuit device used for the terminal of a mobile phone and a base station.

The modulation circuit device 1 consists of an angle modulator 2, a voltage control device 3, an amplitude modulator 4, and amplitude control means 11.

The angle modulator 2 is a circuit to angle-modulate a carrier wave by a phase signal 6 inputted from a second input terminal 9.

The voltage control circuit 3 is used to supply a stable voltage to the amplitude modulator 4, and is a circuit to generate an output signal based on the signal of the output from the amplitude control means 11.

Figure 7:
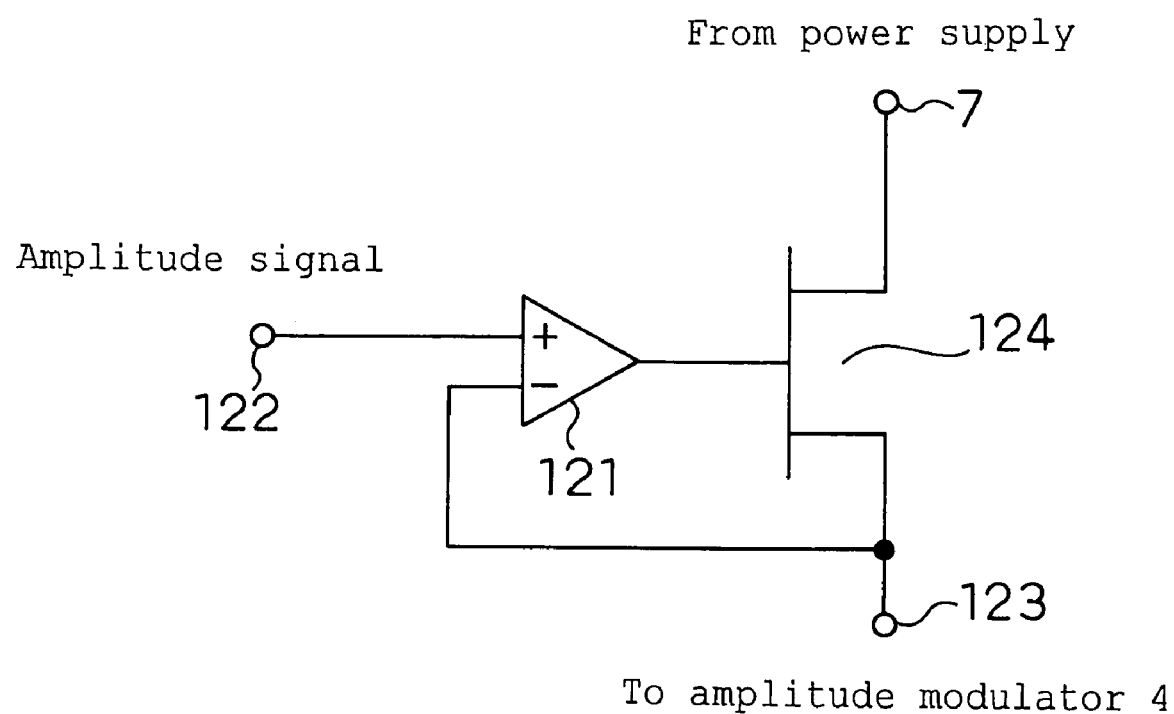
FIG. 7 is a view showing an actual example of a voltage control circuit in the first and second embodiment of the present invention.

As the voltage control circuit 3, a series regulator as shown in FIG. 7 can be used. In FIG. 7, a comparator 121 is a circuit to compare the input signal from an input terminal 122 and the output signal from an output terminal 123, and a transistor 124 is a circuit to control a power supply voltage by the signal from the output of the comparator 121.

The amplitude modulator 4 is a circuit to amplitude-modulate the signal from the output of the angle modulator 2 by the signal from the output of the voltage control circuit 3.

The amplitude control means 11 is means of shaping the waveform of the amplitude signal 5 so that the voltage of the amplitude signal 5 of a portion which becomes small becomes a threshold value when the voltage of the amplitude signal 5 becomes lower than the threshold value.

Figure 6:
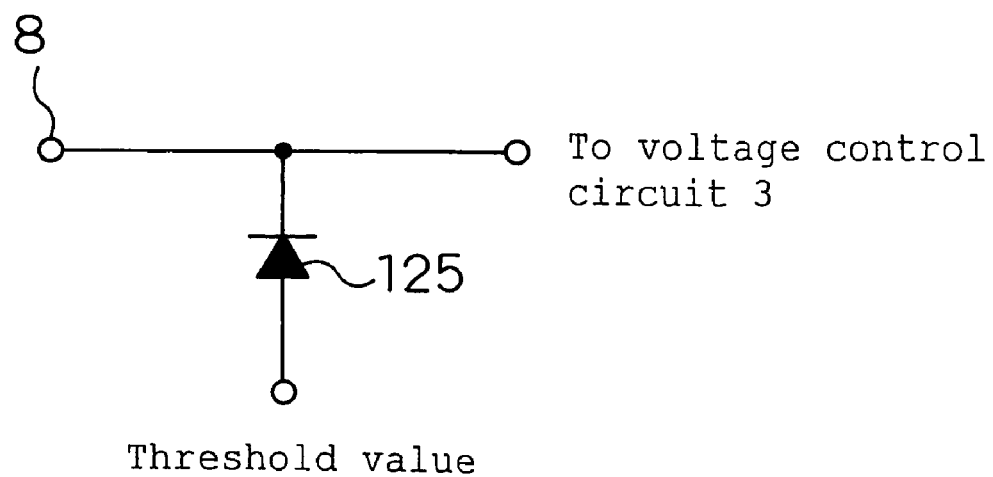
FIG. 6 is a view showing an actual example of amplitude control means in the first and second embodiment of the present invention.

As the amplitude control means 11, a diode 125 as shown in FIG. 6 can be used. Further, the constitution can used in which the amplitude control means 11 is realized by a processor and the digital data after processed is DA-converted into an analogue signal.

Note that, in the case where the diode 125 as shown in FIG. 6 is used as the amplitude control means 11, the voltage of the amplitude signal 5 in the first embodiment is an example of the magnitude of the amplitude signal of the present invention, and in the case where the constitution is such that the amplitude control means 11 is realized by a processor and the digital data after processed is DA-converted into an analogue signal, the magnitude represented by the value of the digital data is the magnitude of the amplitude signal of the present invention.

Figure 8:
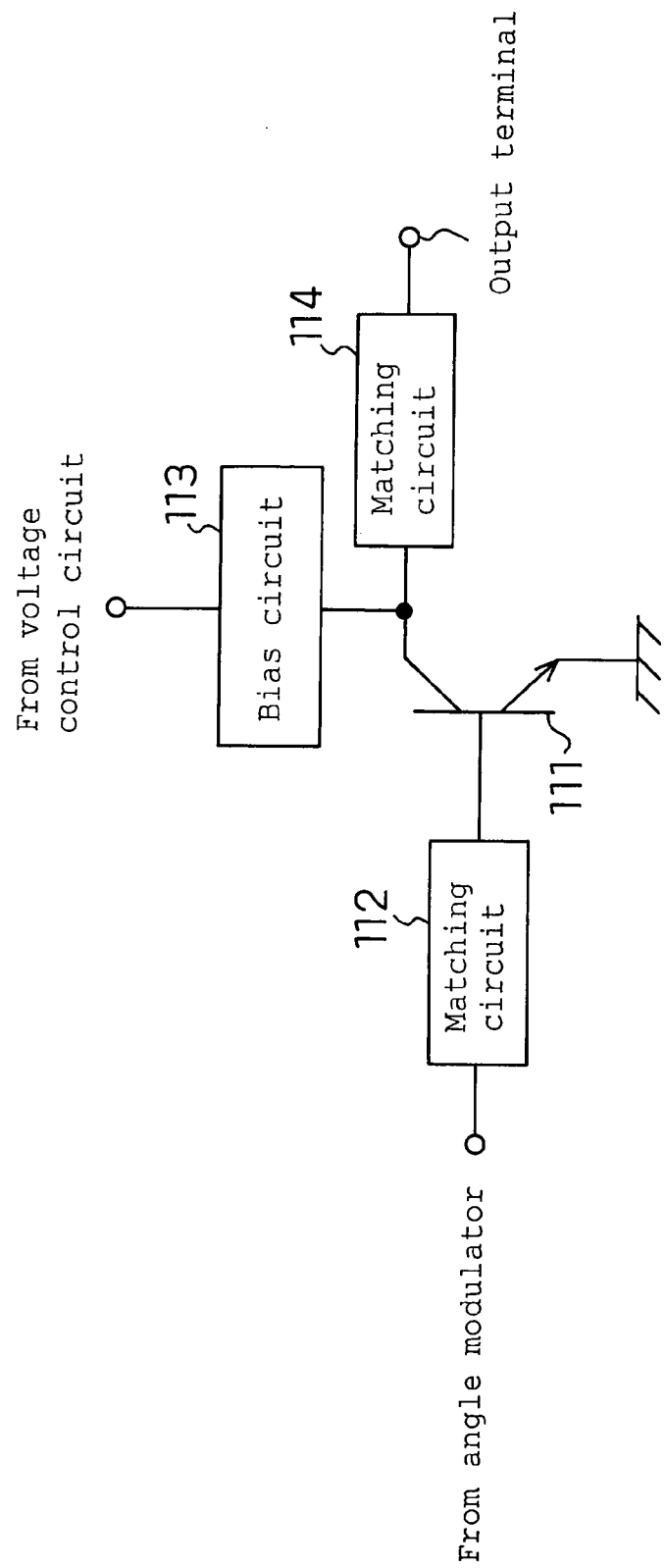
FIG. 8 is a view showing an actual example of amplitude control means in the first and second embodiment of the present invention.

The structure of the amplitude modulator 4 is shown in FIG. 8 similarly to the conventional art.

Next, the operation of the first embodiment as described above will be described.

An amplitude signal 5 and a phase signal 6 are generated from the data inputted to the data generator by an unillustrated data generator. The amplitude signal 5 generated by the data generator is inputted to a first input terminal 8. Further, the phase signal 6 generated by the data generator is inputted to a second input terminal 9.

On the other hand, a power supply voltage is supplied to the voltage control circuit 3 from a power supply terminal 7.

The amplitude signal 5 inputted to the first input terminal 8 is inputted to the amplitude control means 11. The amplitude control means 11 shapes the waveform of the amplitude signal 5 so that the voltage of the amplitude signal 5 of the portion which becomes small becomes a threshold value when the voltage of the amplitude signal 5 inputted from the first input terminal 8 becomes lower than the threshold value.

That is, the amplitude control means 11 shapes the waveform of the amplitude signal 5 in such a way that, when an input voltage of the amplitude control means 11 is taken as $V_i$, a threshold vale as a, and an output voltage of the amplitude control means 11 as $V_0$, $V_0 = V_i$ is established in the case of $V_i$ being more than a, and when $V_i$ is smaller than a, $V_0 = a$ is established. Consequently, for example, when the amplitude signal 5 inputted to the amplitude control means 11 is outputted from the amplitude control means 11, it becomes a waveform in which a portion smaller than the threshold value of the amplitude signal 5 is cut off. In this way, by controlling an amplitude of the amplitude signal 5, the amplitude control means 11 makes a range of the obtainable value of the voltage of the amplitude signal 5 small.

The signal amplitude-controlled at the amplitude control means 11 is inputted to the voltage control circuit 3. The voltage control circuit 3 generates an output signal based on the signal amplitude-controlled by the amplitude control means 11. Usually, the voltage control circuit 3 amplifies the output signal from the amplitude control means 11, and the amplified signal is inputted to the amplitude modulator 4. By using the voltage control circuit 3, a stable voltage can be supplied to the amplitude modulator 4.

That is, the amplitude control means 11 can usually let flow only a little current to the extent of about a few milliamperes as the current of the amplitude signal which is its output. In contrast to this, at the input side from the voltage control circuit 3 of the amplitude modulator 4, usually a large current to the extent from 1 to 2 amperes are let flow. Further, the amplitude modulator 4 has its input impedance changed by an input voltage. Consequently, when the output of the amplitude control means 11 is directly inputted to the amplitude modulator 4 without using the voltage control circuit 3, a voltage change occurs in the output of the amplitude control means 11. To avoid such a voltage change by the change of the input impedance of the amplitude modulator 4 and the like, the voltage control circuit 3 which can let flow a large current and stably supply the voltage is used. By inputting the output signal of the amplitude control means 11 to the amplitude modulator 4 through the voltage control circuit 3, a desired voltage can be supplied.

Further, the phase signal 6 inputted to the second input terminal 9 is inputted to the angle modulator 2. The angle modulator 2 angle-modulates the carrier wave by the phase signal 6 to be inputted. The signal angle-modulated becomes a signal of a constant envelope. The signal angle-modulated at the angle modulator 2 is inputted to the amplitude modulator 4.

The amplitude modulator 4 amplitude-modulates the signal angle-modulates at the angle modulator 2 by the signal from the output of the voltage control circuit 3. That is, the signal from the output of the voltage control circuit 3 is inputted to the collector of the bipolar transistor 111 constituting the amplitude modulator 4 through the bias circuit 113. Further, the signal from the output of the angle modulator 2 is inputted to the base of the bipolar transistor 111 through a matching circuit 112. An output signal is outputted from the collector of the bipolar transistor 111 through the matching circuit.

That is, by controlling a collector voltage of the bipolar. transistor 111 by the signal from the output of the voltage control circuit 3, the amplitude modulator 4 outputs a signal treated with both of the angle modulation and amplitude modulation. By so doing, the signal from the output of the amplitude modulator 4 becomes a signal in which an envelope changes. The signal from the output of the amplitude modulator 4 is outputted from the output terminal 10 as a polar modulated signal.

Note that a FET may be used instead of the bipolar transistor 111 as the amplitude modulator 4.

Further, as the angle modulator 2, a phase modulator to perform a phase modulation and a frequency modulator to perform a frequency modulation can be used.

Figure 10:
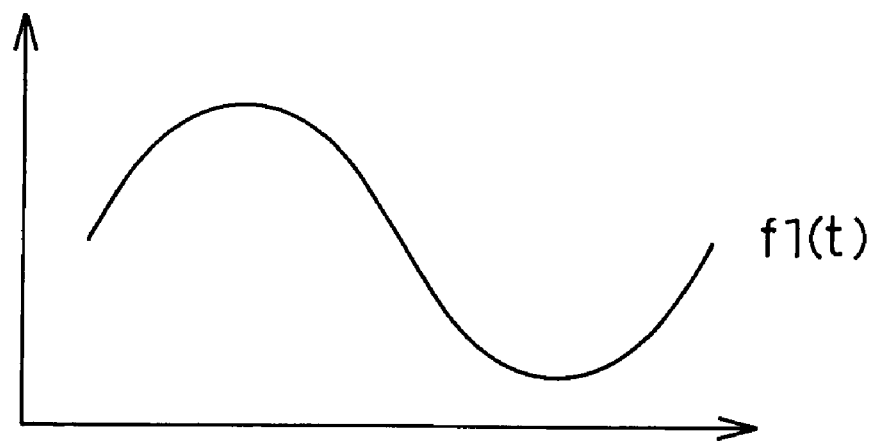
FIG. 10(a) is a view showing one example of an amplitude signal in the first and second embodiment of the present invention.
FIG. 10(b) is a view showing one example of a signal of an output of the voltage control circuit in the first and second embodiment of the present invention.
Figure 10:
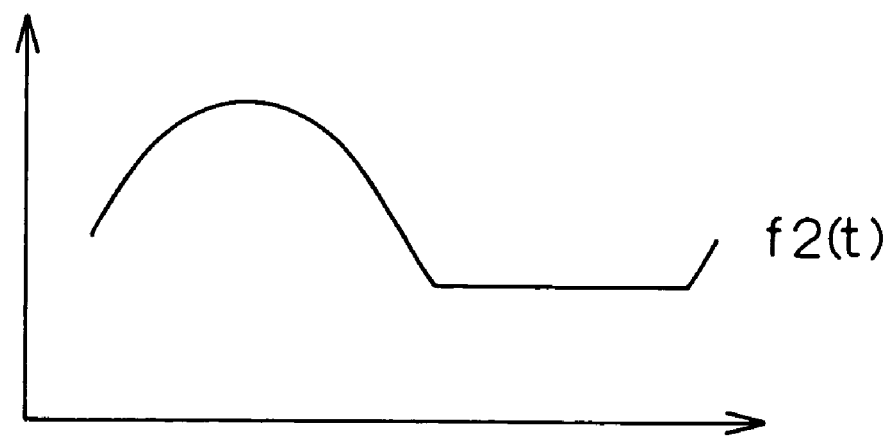

In FIG. 10 are shown the amplitude signal 5 before inputted to the amplitude control means 11 and the signal outputted from the voltage control circuit 3. That is, FIG. 10(a) shows the amplitude signal 5 before inputted to the amplitude control means 11, and FIG. 10(b) shows the signal outputted from the voltage control circuit 3. The amplitude signal 5 before inputted to the amplitude control means 11 is taken as f1 (t), the signal from the output of the voltage control circuit 3 as f2 (t) and the envelope of the signal of the output of the amplitude modulator 4 as f3 (t), and a is taken as a constant. Where, t is a time. At this time, f1 (t) is a signal as shown in FIG. 10(a), and the f2 (t) is a signal as shown in FIG. 10(b). That is, f2 (t) is a signal in which a portion smaller than the threshold value of fi (t) is cut off. Further, f3 (t)=a×f2 (t) is established. That is, the signal from the output of the voltage control circuit 3, as described above, has the amplitude signal 5 amplitude-controlled, and at the same time, the amplitude-controlled signal is amplified. Further, the envelope f3 (t) becomes a signal in which the signal from the output of the voltage control circuit 3 is amplified.

Figure 9A:
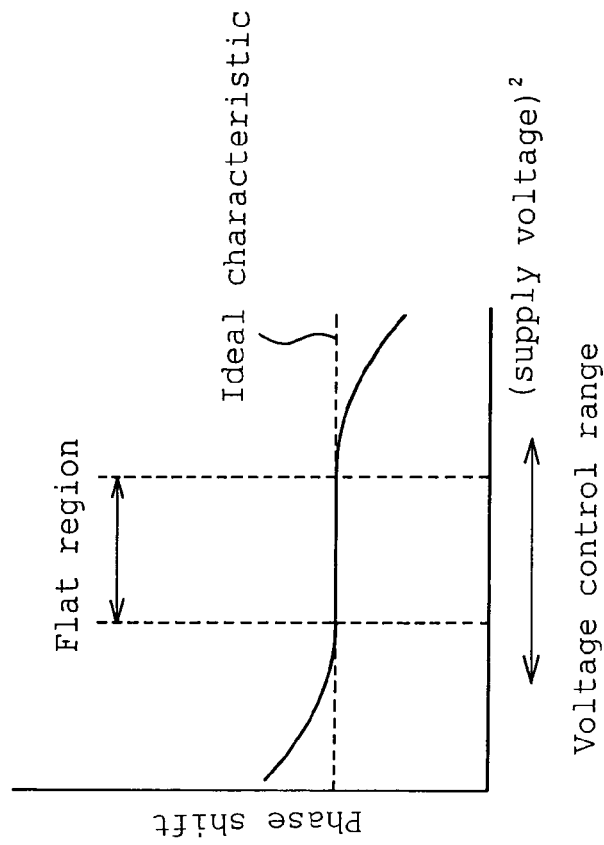
FIG. 9(a) is a view showing a relationship between a second power of a supply voltage of the amplitude modulator and an output power in a conventional art and the first and second embodiment of the present invention.
Figure 9B:
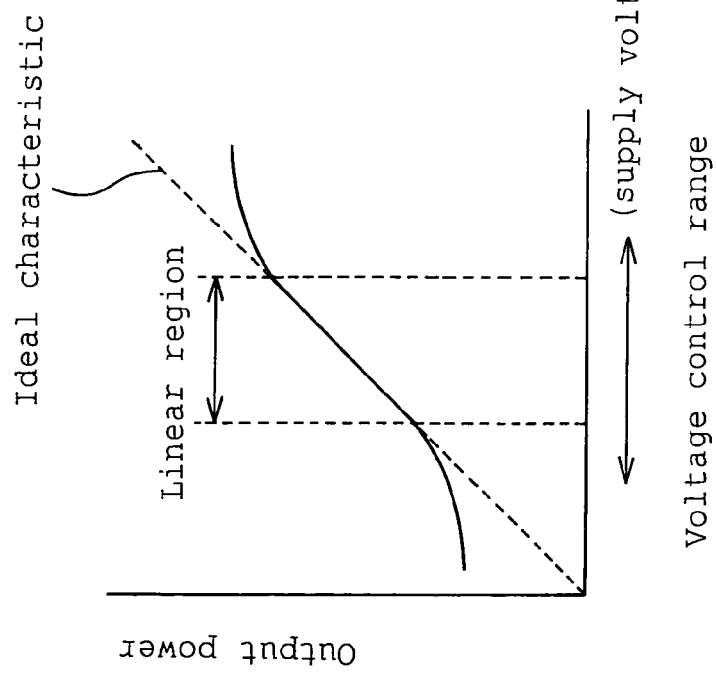
FIG. 9(b) is a view showing a relationship between a second power of a supply voltage of the amplitude modulator and a phase shift in the conventional art and the first and second embodiment of the present invention.

In FIG. 9(a) is shown a relationship between the second power of the voltage supplied from the voltage control circuit 3 to the amplitude modulator 4 and the output power of the amplitude modulator 4. Further, in FIG. 9(b) is shown a relationship between the second power of the voltage supplied from the voltage control circuit 3 to the amplitude modulator 4 and the phase shift of the amplitude modulator 4. In FIGS. 9(a) and 9(b) is shown the range of the second power of the voltage which can be amplitude-modulated without distortion of the common region of the linear region and the flat region.

The voltage control circuit 3 does not allow the signal to experience the whole or a part of the non-linear region of FIGS. 9(a) and 9(b).

To achieve this, the threshold value of the amplitude control means 11 may be decided as follows. That is, a simulation result, which has decided the threshold value of the amplitude control means 11, is shown in FIG. 11.

Figure 11:
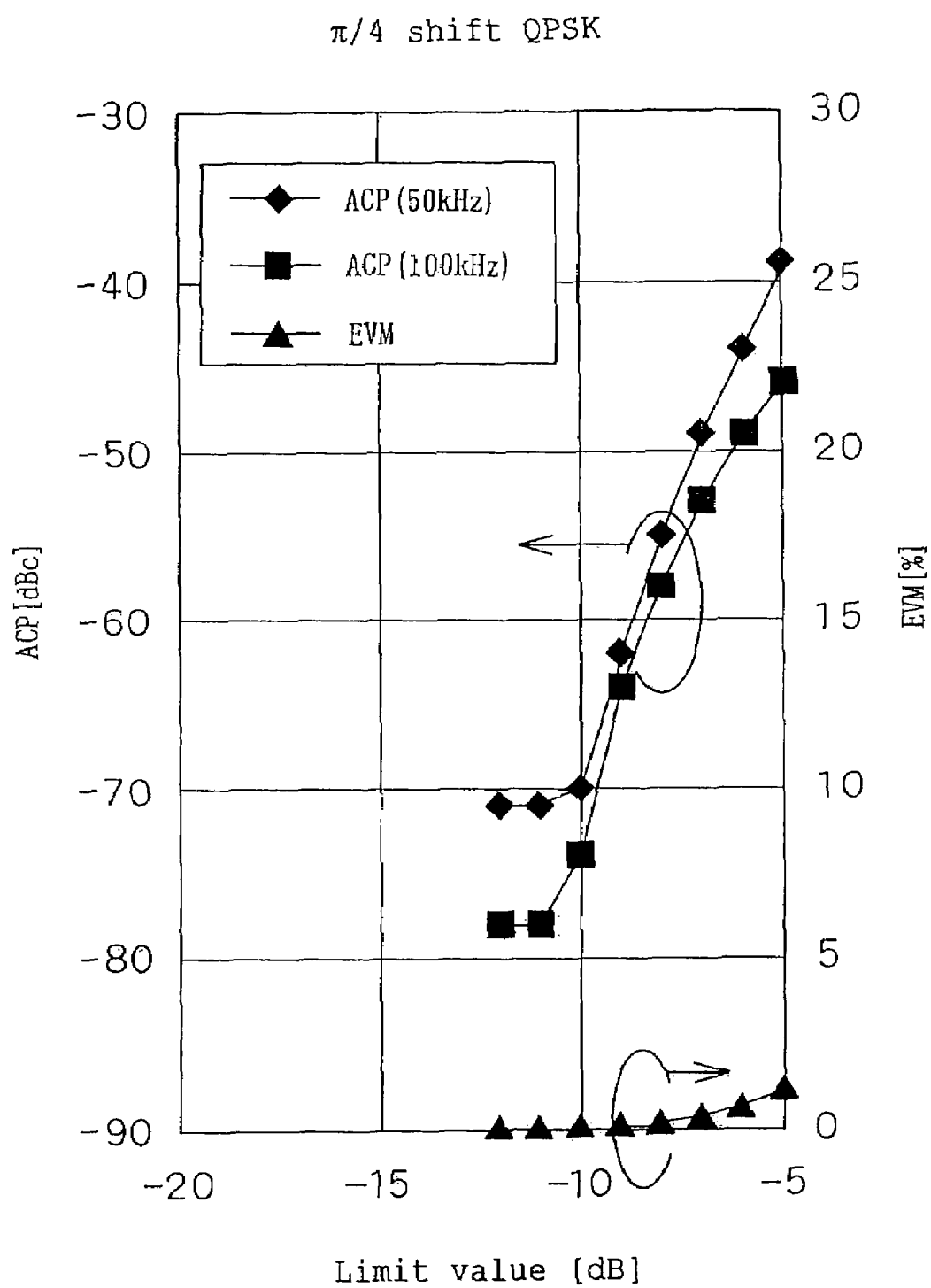
FIG. 11 is a view for explaining about how to decide a threshold value in the first and second embodiment of the present invention.

FIG. 11 is a view in which an ACP (adjacent channel leakage power) and an EVM (error vector magnitude) at the time when the threshold value used for controlling the amplitude is changed in the modulation circuit device 1 are found by a simulation and plotted. Note that the abscissa shows a threshold value, and the zero decibel of the longitudinal axis shows an amplitude equivalent to an average power. Note also that, as simulation conditions, π/4 shift QPSK is used as a modulation wave, 21 KHz as a symbol rate, and a root raised cosign (a roll off rate 0.5) as a filter. The ACP is 21 KHz in integral bandwidth, and values of 50 KHz detuning and 100 KHz detuning are found. In FIG. 11, when the ACP is specified as below −50 dBc, and the EVM as below 10%, it is clear that the threshold value should be specified as −8 decibel. In this way, the portion of the signal which is lower than this threshold value can be limited to this threshold value. The threshold value may be decided in this way so that the specifications of the ACP and the EVM are satisfied.

The amplitude control of the amplitude signal is performed in this way by the amplitude control means 11, and by amplifying the signal amplitude-controlled by the voltage control circuit 3, when the amplitude modulator 4 amplitude-modulates the signal from the output of the angle modulator 2 by the signal from the output of the voltage control circuit 3, there occurs no distorted component at the amplitude modulator 4. In this way, the amplitude control means 11 controls the amplitude of the amplitude signal 5, and the voltage control circuit 3 amplifies the amplitude-controlled signal so that the signal does not experiences a whole or a part of the non-linear regions of FIGS. 9(a) and 9(b), and therefore, there is no need to widely secure the dynamic range of the amplitude modulator 4, and a desired modulation wave can be outputted.

In FIG. 12(a) is shown a power spectrum of the signal in the output terminal 110 of a modulation circuit device 101 as described in the conventional art. Further, in FIG. 12(b) is shown a power spectrum of the signal in the output terminal 10 at the time when the amplitude control circuit 11 controls the amplitude signal 5 at −8 decibel in the modulation circuit device 1 of the first embodiment. Where, as the amplitude modulator 104 of the modulation circuit device 101, a modulator sufficiently wide in the linear region shown in FIGS. 9(a) and 9(b) is used. Consequently, the power spectrum of the signal in the output terminal 110 of the amplitude modulator 101 is equivalent to the power spectrum at time when no distortion occurs at the amplitude modulator 104. When FIGS. 12(a) and 12(b) are compared, it is understood that, though the spectrum is slightly deteriorated in FIG. 12(b), the specifications are satisfied.

Further, since the signal inputted to the voltage control circuit 3 is controlled in the amplitude by the amplitude control means 11, the dynamic range is made small. Consequently, a circuit small in the voltage control range can be used as the voltage control circuit 3 so that the voltage control circuit 3 can be miniaturized.

Figure 32:
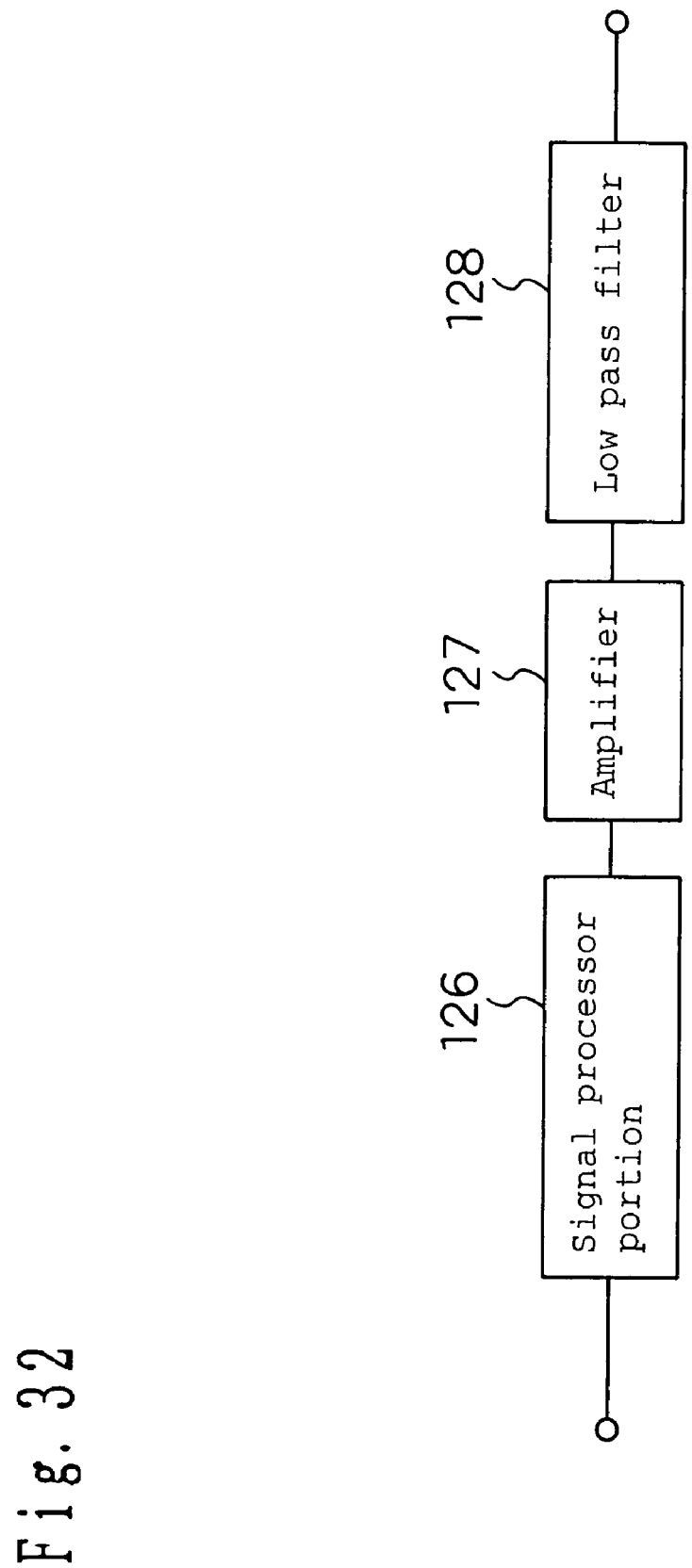
FIG. 32 is a view showing an example of a switching regulator used as the voltage control circuit.

Note that, in the first embodiment, though an explanation was made that the series regulator is used as the voltage control circuit 3, it is not limited to this. A switching regulator may be used as the voltage control circuit 3. In FIG. 32 is shown an example of such a switching regulator. That is, in the switching regulator of FIG. 32, a signal processor portion 126 converts signals to be continuously inputted into pulse signals such as PWM and the like, and an amplifying portion 127 amplifies the converted signals, and the spurious of the signals from the output of the amplifier is removed by a low pass filter 128.

Figure 2:
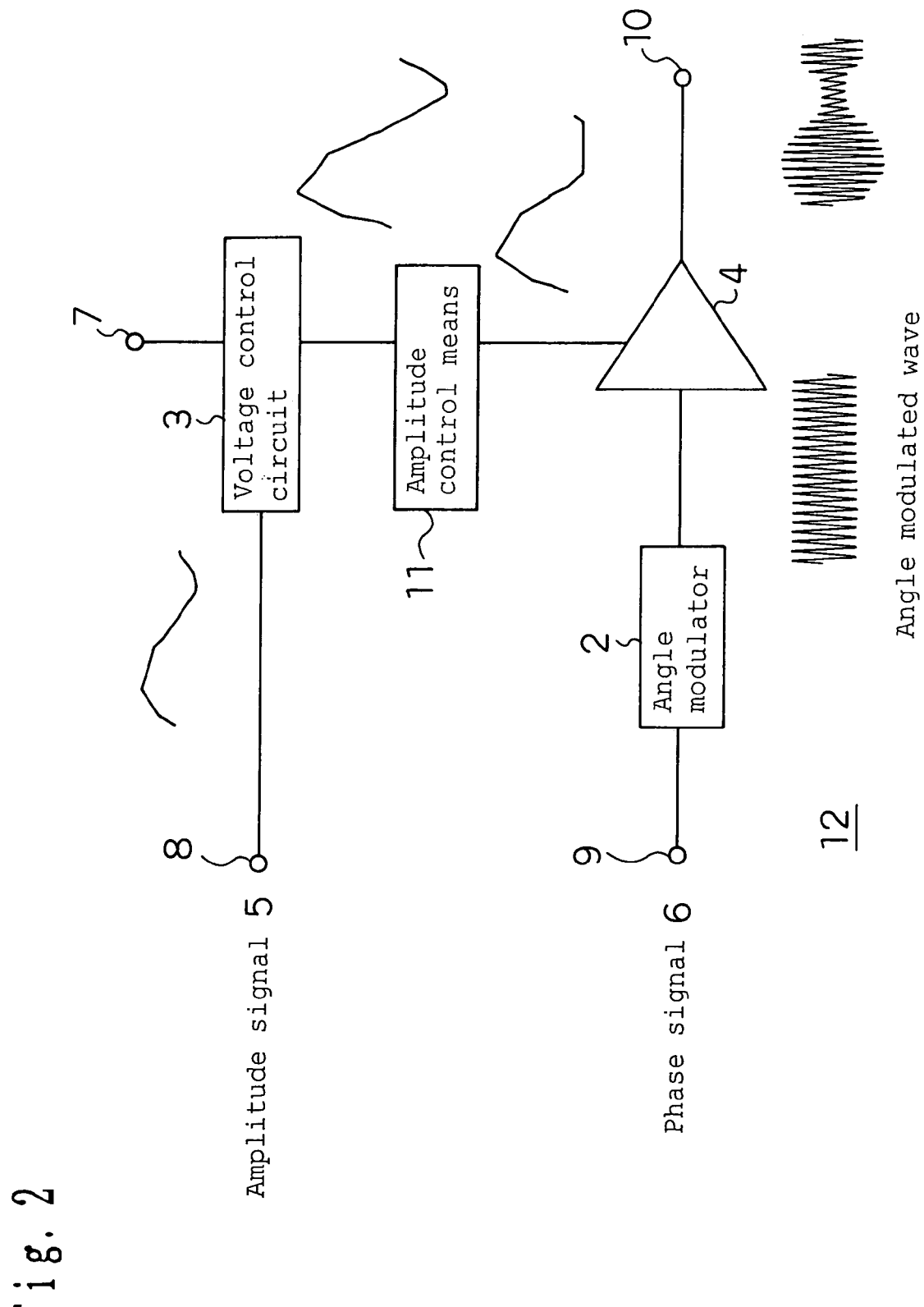
FIG. 2 is a view showing another structure of the modulation circuit device of the first embodiment of the present invention.

Note that, in the first embodiment, though the voltage control circuit 3 is arranged at the subsequent stage of the amplitude control means 11, it is not limited to this. The voltage control circuit 3 may be arranged at the preceding stage of the amplitude control means 11. In FIG. 2 is shown a modulation circuit device 12 in which the voltage control circuit 3 is arranged at the preceding state of the amplitude control means 11.

In FIG. 2, after having been amplified at the voltage control circuit 3, the amplitude signal 5 is inputted to the amplitude control means 11, and is amplitude-controlled. The voltage control circuit 3 amplifies the amplitude signal 5 so that the range of the voltage of the amplitude-controlled signal does not experiences a whole or a part of the non-linear regions of FIGS. 9(a) and 9(b).

Comparing to the case where the voltage control circuit 3 is arranged at the subsequent stage of the amplitude means 11 similarly to the modulation circuit device 1, though it is necessary to widen a voltage control range of the voltage control circuit 3, the advantage equivalent to the first embodiment can be obtained.

Further, in the modulation control circuit device 1 of the first embodiment, though the explanation was made that the amplitude control means 11 and the voltage control circuit 3 are provided, it is not limited to this. The voltage control circuit 3 can be allowed to serve as the function of the amplitude control means 11 without providing the amplitude control means 11.

That is, when the voltage control circuit 3 having a dynamic range which does not experiences a whole or a part of the non-linear regions of the FIGS. 9(a) and 9(b) is used, the voltage control circuit 3 can be allowed to serve as the function of the amplitude control means 11. That is, when a high voltage or a low voltage higher than the dynamic range of the voltage control circuit 3 is inputted, an amplitude limiter is applied to that portion, so that an operation equivalent to the amplitude control means 11 can be performed. Consequently, by using the voltage control circuit 3 having the dynamic range which meets the characteristics of the amplitude modulator 4 as the voltage control circuit 3, the amplitude control means 11 can be omitted.

Furthermore, in the modulation circuit device 1 and the modulation circuit device 12 of the present embodiment, though the explanation was made that the amplitude control means 11 shapes the waveform of the amplitude signal so that the voltage of the amplitude signal of the portion which becomes small becomes a threshold value when the voltage of the amplitude signal becomes lower than the threshold value, it is not limited to this.

When the voltage of the amplitude signal to be inputted becomes a larger than the threshold value, the waveform of the amplitude signal may be shaped so that the voltage of the amplitude signal of the portion which becomes large becomes the threshold value. That is, the amplitude control means 11 may shape the waveform of the amplitude signal so that the control means 11 becomes a waveform in which the portion larger than the threshold value of the amplitude signal is cut off.

However, since the cutting off of the higher portion of the voltage of the amplitude signal rather than the cutting off of the lower portion of the voltage of the amplitude signal makes instantaneous energy of the cut off portion larger, the influences of distortion and the like becomes large. Except for this, the advantage equivalent to the first embodiment can be obtained.

Further, when the voltage of the amplitude signal becomes smaller than the threshold value, the voltage of the amplitude signal of the portion which becomes small may shape the waveform of the amplitude signal so that it becomes a first threshold value, and the same time, when the voltage of the amplitude signal becomes larger than a second threshold value which is larger than the first threshold value, the voltage of the amplitude signal of the portion which becomes large may shape the waveform of the amplitude signal so that it becomes the second threshold value. That is, the advantage equivalent to the first embodiment can be obtained even when the amplitude control means 11 cuts off a portion smaller than the first threshold value of the amplitude signal, and at the same time, shapes the waveform of the amplitude signal so that the control means becomes the waveform which cuts off a portion larger than the second threshold value.

Note that the threshold value of the present embodiment is an example of a first prescribed value of the present invention, and a first threshold value of the present embodiment is an example of a first prescribed value of the present invention, and a second threshold value of the present embodiment is a second prescribed value of the present invention, and the amplitude control means 11 and the voltage control circuit 3 are examples of waveform shaping means of the present invention.

Second Embodiment

Next, a second embodiment will be described.

Figure 3:
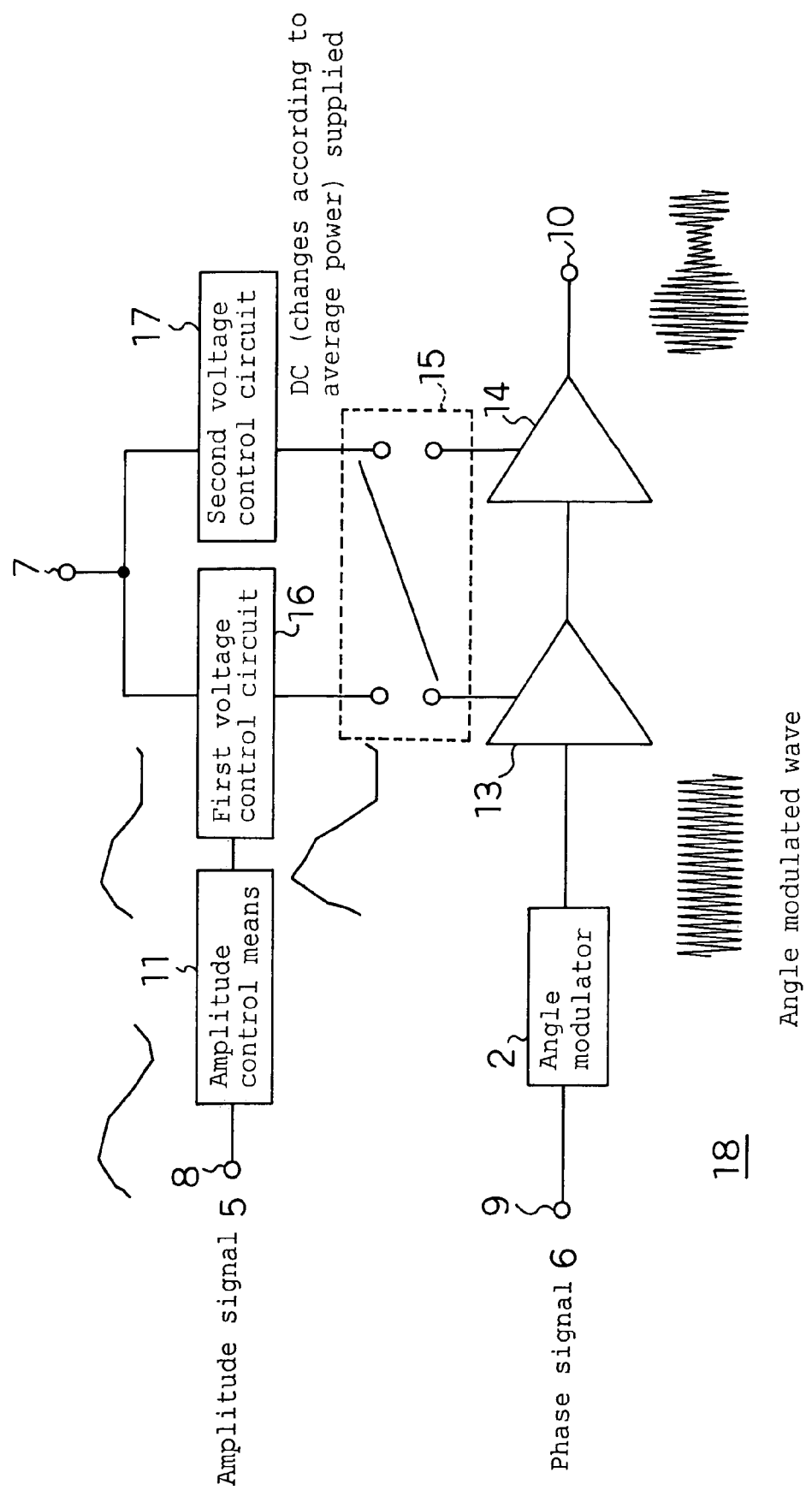
FIG. 3 is a view showing the structure of the modulation circuit device in a second embodiment of the present invention.

In FIG. 3 is shown a constitution of a modulation circuit device 18 of the second embodiment. The modulation circuit device 18 of the second embodiment is used for a radio communication device, which has a function to control a transmission power according to the distance between the base station of a mobile phone and a terminal.

The modulation circuit device 18 of the second embodiment, similarly to a conventional art, is used for a transmission circuit device used in the terminal of a mobile phone and a base station. Particularly, the modulation circuit device 18 of the second embodiment is suitable for a transmitter having a power control function.

That is, the modulation circuit device 18 consists of an angle modulator 2, amplitude control means 11, a first amplitude modulator 13, a second amplitude modulator 14, a switch 15, a first voltage control circuit 16, and a second voltage control circuit 17.

The angle modulator 2 is a circuit to angle-modulate a carrier wave by a phase signal 6 inputted from a second input terminal 9.

The first voltage control circuit 16 is used for supplying a stable voltage to the amplitude modulator 4, and is a circuit to generate an output signal based on the signal from the output of the amplitude control means 11.

The second voltage control circuit 17 is a circuit to supply a direct current corresponding to the output power of the radio communication device integrated with the modulation circuit device of the second embodiment.

The first amplitude modulator 13 is a circuit to amplitude-modulate the signal from the angle modulator 2 by the signal from the output of the switch 15.

The second amplitude modulator 14 is a circuit to amplitude-modulate the signal from the output of the first amplitude modulator 13 by the signal from the output of the switch 15.

The switch 15 is a circuit, in which when a transmission power is controlled so as to become larger than a prescribed value, the signal from the output of the second voltage control circuit 17 is inputted to the first amplitude modulator 13, and the signal from the output of the first voltage control circuit 16 is inputted to the second amplitude modulator 14, and when the transmission power is controlled to be below the prescribed value, the signal from the output of the second voltage control circuit 17 is inputted to the second amplitude modulator 14, and the signal from the output of the first voltage control circuit 16 is inputted to the first amplitude modulator 13.

The amplitude control means 11 is means of shaping the waveform of the amplitude signal 5 so that the voltage of the amplitude signal 5 of a portion which becomes small becomes a threshold value when the voltage of the amplitude signal 5 becomes lower than the threshold value.

Next, such an operation of the second embodiment will be described with the difference with the first embodiment focused.

The power supply voltage from the power supply terminal 7 is supplied to the first voltage control circuit 16 and the second voltage control circuit 17.

The amplitude control means 11, similarly to the first embodiment, amplitude-controls the amplitude signal 5. The signal from the output of the amplitude control means 11 is inputted to the first voltage control circuit 16.

The first voltage control circuit 16, similarly to the voltage control circuit 3 of the first embodiment, generates an output signal based on the signal from the output of the amplitude control means 11.

On the other hand, the second voltage control circuit 17 supplies a direct current corresponding to the output power of the radio communication device integrated with the modulation circuit device of the second embodiment. That is, the second voltage control circuit 17 inputs a signal (not shown) showing the magnitude of the output power, and based on this signal, supplies the direct current corresponding to the output power.

Further, the operation of the angle modulator 2 is the same as the first embodiment.

Here, the switch 15 operates as follows. That is, when the transmission power of the radio communication device integrated with the modulation circuit device 18 is controlled so as to become larger than the prescribed value, the switch 15 inputs the signal from the output of the second voltage control circuit 17 to the first amplitude modulator 13, and input the signal from the output of the first voltage control circuit 16 to the second amplitude modulator 14. Further, when the transmission power of this radio communication device is controlled so as to become below the prescribed value, the switch 15 inputs the signal from the output of the second voltage control circuit 17 to the second amplitude modulator 14, and inputs the signal from the output of the first voltage control circuit 16 to the first amplitude modulator 13.

Consequently, when the transmission power of the radio communication device is controlled to become larger than the prescribed value, the direct current is supplied to the first amplitude modulator 13, and therefore, the modulator 13 functions as an amplifier. Consequently, the first amplitude modulator 13 amplifies the signal from the angle modulator 2, and outputs it to the second amplitude modulator 14.

The second amplitude modulator 14 amplitude-modulates the signal from the output of the first amplitude modulator 13 by the signal from the output of the first voltage control circuit 16.

On the other hand, when the transmission power of the radio communication device is controlled to become lower than the prescribed value, the signal from the output of the first voltage control 16 is inputted to the first amplitude modulator 13. Consequently, the first amplitude modulator 13 amplitude-modulates the signal from the output of the angle modulator 2 by the signal from the output of the first voltage control circuit 16.

Since the direct current voltage is inputted to the second amplitude modulator 14, it functions as the amplifier. That is, the second amplitude modulator 14 amplifies the signal from the output of the first amplitude modulator 13.

In this way, the signal which is polar-modulated from the output terminal 10 is outputted.

Further, when the transmission power of the radio communication device integrated with the modulation circuit device of the second embodiment is controlled so as to become below the prescribed value, that is, when the first amplitude modulator 13 functions as a modulator, and the second amplitude modulator 14 functions as an amplifier, the second voltage control circuit 17 supplies the direct current voltage corresponding to the output power of the radio communication device to the second amplitude modulator 14, so that, even when the transmission power of the radio communication device is small, the consumption power can be reduced. That is, in this case, as the transmission power of the radio communication device is reduced, the second voltage control circuit 17 supplies the smaller amount of transmission power, so that the consumption power can be reduced when the transmission power is small.

In this way, when the output power of the radio communication device is small, the supply voltage from the second voltage control circuit 17 is lowered, thereby making it possible to lower the consumption power.

By performing the above-described operation, even when a power control of the transmission power of the radio communication device is performed, the situation can be addressed. That is, the second amplitude modulator 14 operates as the amplifier at a low outputting time, and moreover, lowers the supply voltage, thereby maintaining a high efficiency.

Note that, in the present embodiment, though the explanation was made that, at the low outputting time, the second amplitude modulator 14 functions as the amplifier, at the low outputting time, the second amplitude modulator 14 is not used, but the signal from the output of the first amplitude modulator 13 may be controlled so as to be directly outputted to the output terminal 10.

Figure 4:
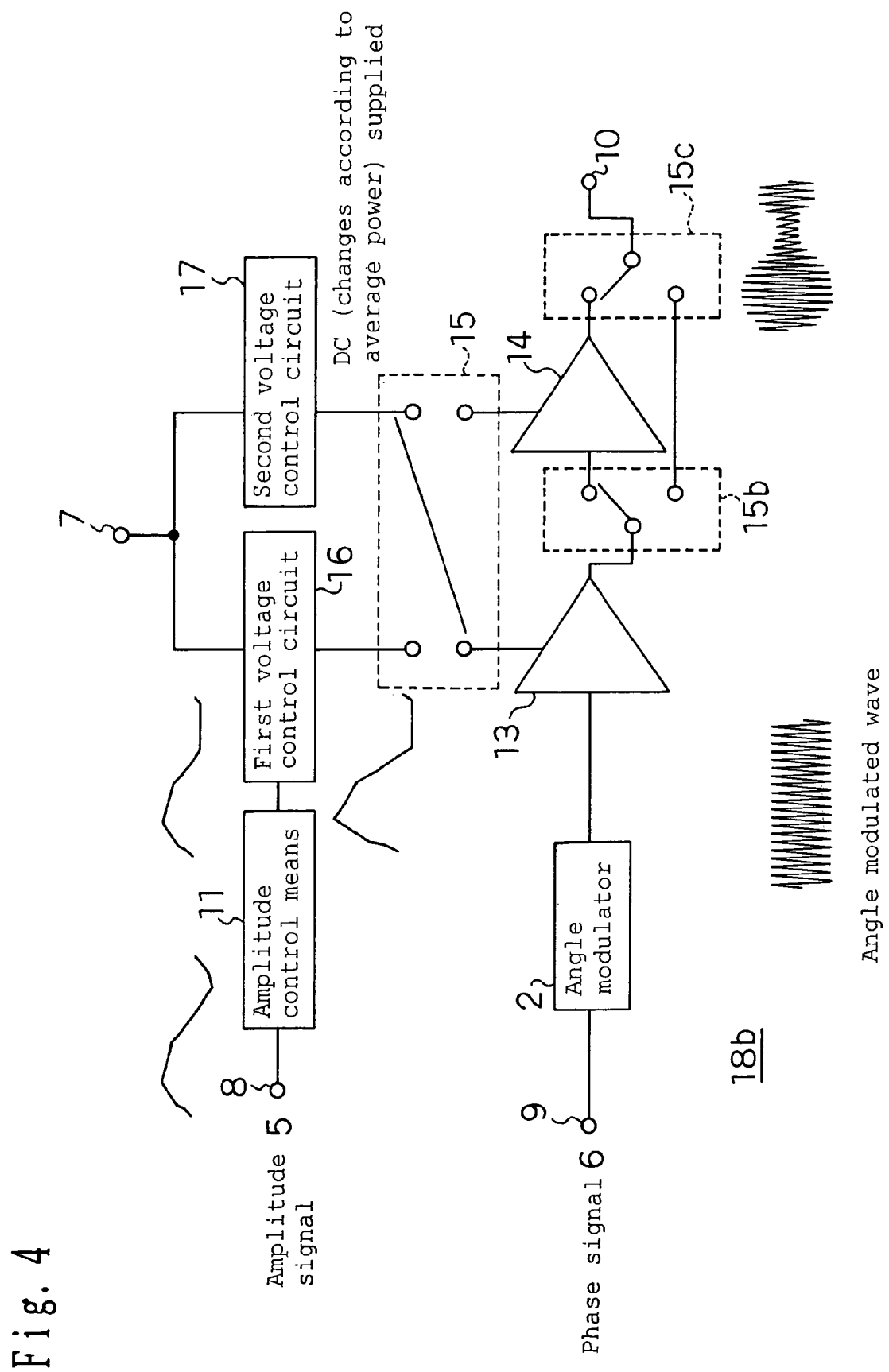
FIG. 4 is a view showing another structure of the modulation circuit device in the second embodiment of the present invention.

In FIG. 4 is shown a modulation circuit device 18b to control the signal from the output of the first amplitude modulator 13 to be directly outputted to the output terminal 10 without using the second amplitude modulator 14 at the low outputting time. In the modulation circuit device 18b of FIG. 4, a switch 15b and a switch 15c operate as follows. That is, when the transmission power of the radio communication device integrated with the modulation circuit device 18b is controlled so as to become larger than the prescribed value, the switch 15b and the switch 15c are changed over so that the signal from the output of the first amplitude modulator 13 is inputted to the second amplitude modulator 14. Further, when the transmission power of this radio communication device is controlled so as to become below the prescribed value, the switch 15b and the switch 15c are changed over so that the signal from the output of the first amplitude modulator 13 is inputted to the output terminal 10. The operation other than this is the same as the above-described modulation circuit device 18.

Further, in the present embodiment, though the first voltage control circuit 16 is provided at the subsequent stage of the amplitude control means 11, it is not limited to this. The first voltage control circuit 16 may be provided at the preceding state of the amplitude control means 11.

Figure 5:
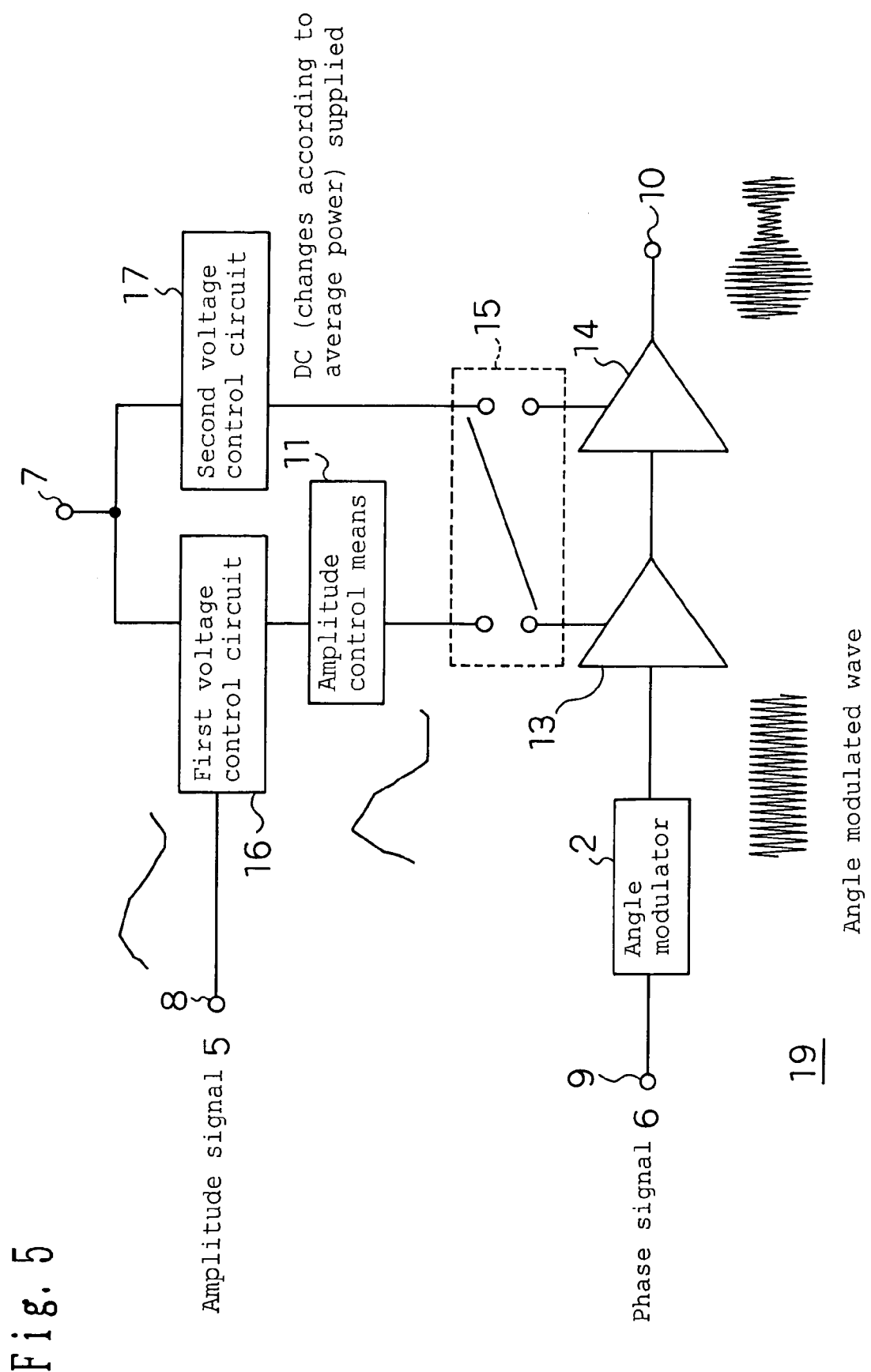
FIG. 5 is a view showing another structure of the modulation circuit device in the second embodiment of the present invention.

In FIG. 5 is shown a modulation circuit device 19 provided with a first voltage control circuit 16 at the preceding stage of the amplitude control means 11.

In FIG. 5, the amplitude signal 5 is amplified at the first voltage control circuit 16, and after that, is inputted to the modulation control means 11 and is amplitude-controlled. Even by so doing, the same advantages as the second embodiment can be obtained.

Further, with regard to the modification of the amplitude control means and the voltage control means described in the first embodiment, it can be similarly adapted to the second embodiment.

Note that the amplitude control means 11 and the first voltage control circuit 16 of the present embodiment are examples of the waveform shaping means of the present invention, and the second voltage control circuit 17 of the present embodiment is an example of the direct current supply circuit of the present invention.

Third Embodiment

Next, a third embodiment will be described.

The amplitude control means 11 of the first embodiment as described by using FIG. 1 shapes the waveform of the amplitude signal 5 so that the voltage of the amplitude signal 5 of a portion which becomes small becomes a threshed value when the voltage of the amplitude signal 5 inputted from the first input terminal 8 becomes lower than the threshold value. For example, when the signal shown in FIG. 10(a) is inputted to the amplitude control means 11 as the amplitude signal 5, as a result of performing the waveform shaping at the amplitude control means 11, the signal shown in FIG. 10(*b*) is outputted from the voltage control circuit.

As evident from FIG. 10(*b*), with regard to the waveform of the signal outputted from the amplitude control means 11 of the first embodiment, the intersecting point with the signal which is cut and shaped by the threshold value and the signal which is not cut nor shaped by the threshold value from among the amplitude signals 5 to be inputted is protruded.

In this way, the signal waveform-shaped at the amplitude control means 11 has a protruded portion as shown in FIG. 10(*a*), and therefore, comparing to the amplitude signal 5 before waveform-shaped at the amplitude means 11, it has the power spectrum distributed in a wider frequency range. Consequently, when the signal amplitude-modulated at the amplitude modulator 4 is also waveform-shaped at the amplitude control means 11, it has the power spectrum distributed in a wider frequency range comparing to the case of not being waveform-shaped. Consequently, there is a problem in that, when the modulation circuit device 1 of the first embodiment is used, the frequency bandwidth occupied by the signal outputted from the output terminal 10 ends up being widen.

In the third embodiment, considering the above-described problem, a modulation circuit device will be described, in which, when the amplitude signal is waveform-shaped by the amplitude control means, the intersecting point with the signal which is cut and shaped by the threshold value and the signal which is not cut nor shaped by the threshold value from among those amplitude signals is formed round and waveform-shaped, so that the frequency distribution range is not allowed to be widen.

Figure 13:
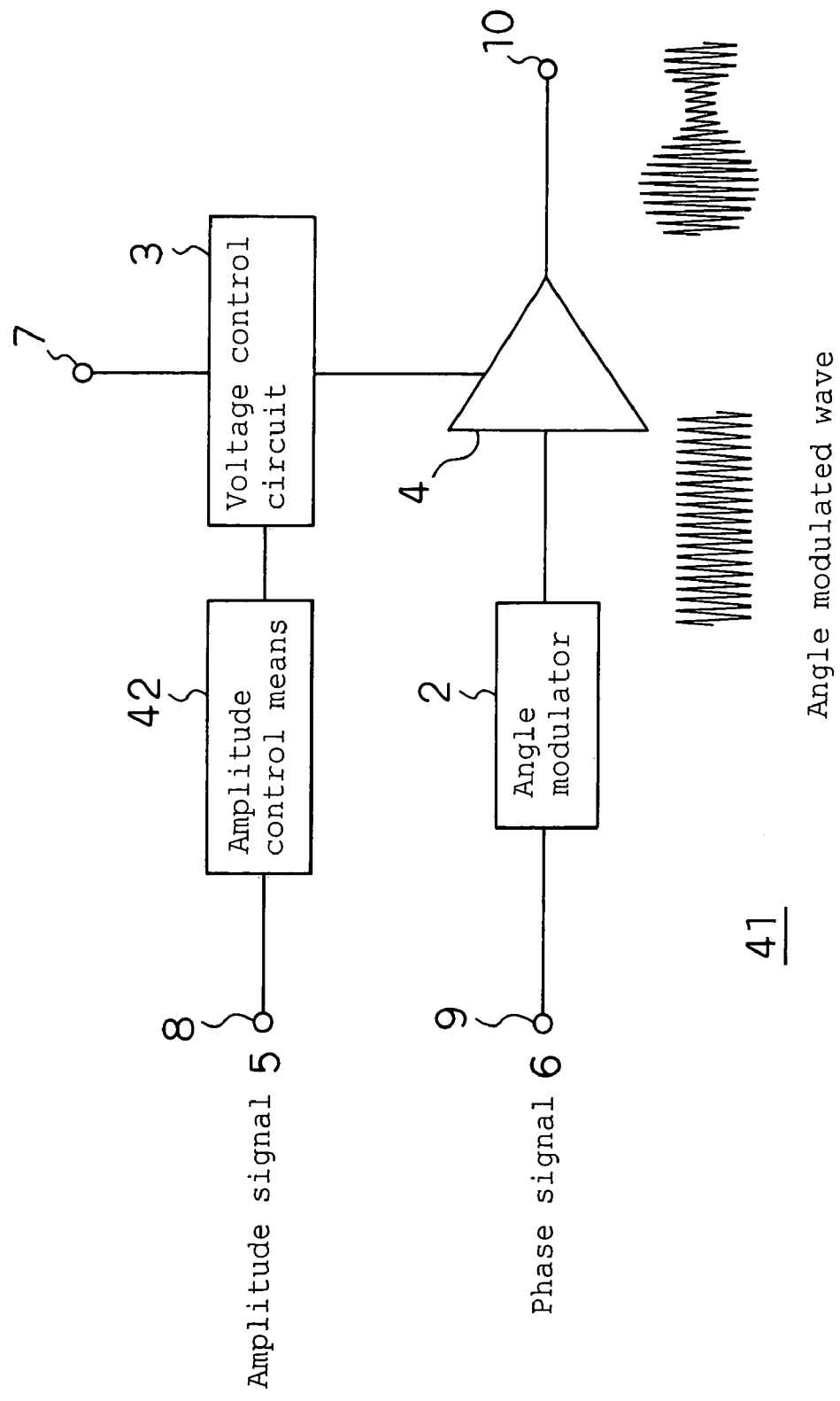
FIG. 13 is a view showing the constitution of the modulation circuit device in a third embodiment of the present invention.

In FIG. 13 is shown a modulation circuit device 41 of the third embodiment.

The difference of the modulation circuit device 41 of the third embodiment with the modulation circuit device 1 of the first embodiment is that the modulation circuit device 41 of the third embodiment comprises the amplitude control means 42 in replacement of the amplitude control means 11 of the first embodiment.

The amplitude control means 42 is means in which, similarly to the first embodiment, when the voltage of the amplitude signal 5 becomes lower than the threshold value, the waveform of the amplitude signal 5 is shaped so that the voltage of the amplitude signal of the portion which becomes small becomes the threshold value, and at the same time, the intersecting point with the signal which is cut and shaped by the threshold value and the signal which is not cut nor shaped by the threshold value from among the amplitude signals 5 to be inputted is formed round and waveform-shaped.

Other than this is the same as the first embodiment, and therefore, the description thereof will be omitted.

Next, such an operation of the third embodiment will be described with the difference with the first embodiment focused.

An amplitude signal 5 and a phase signal 6 are generated from the data inputted to a data generator by an unillustrated data generator. The amplitude signal 5 generated by the data generator is inputted to a first input terminal 8. Further, the phase signal 6 generated by the data generator is inputted to a second input terminal 9.

On the other hand, the power supply voltage is supplied to a voltage control circuit 3 from the power supply terminal 7.

The amplitude signal 5 inputted to the first input terminal 8 is inputted to the amplitude control means 42. When the voltage of the amplitude signal 5 inputted from the first input terminal 8 becomes lower than the threshold value, the amplitude control means 42 shapes the waveform of the amplitude signal 5 so that the voltage of the amplitude signal of the portion which becomes small becomes the threshold value, and at the same time, the intersecting point with the signal which is cut and shaped by the threshold value and the signal which is not cut nor shaped by the threshold value from among the amplitude signals to be inputted is formed round and waveform-shaped.

Figure 15:
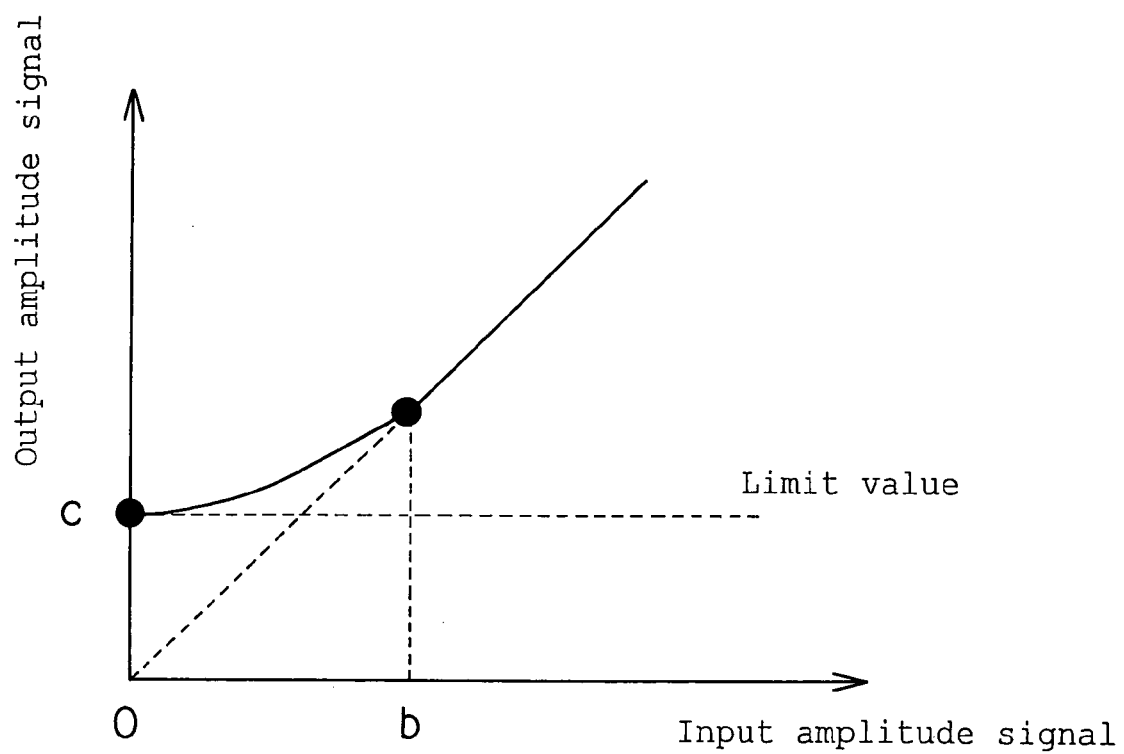
FIG. 15 is a characteristic diagram showing the relationship between an input amplitude signal of the amplitude control means and an output amplitude signal in the third embodiment of the present invention.

In FIG. 15 is shown the relationship between the voltage of the input amplitude signal inputted to the amplitude control means 42, that is, the voltage of the amplitude signal 5 and the voltage of the output amplitude signal outputted from the amplitude control means 42. Whichever value the voltage of the input amplitude signal takes, the voltage of the output amplitude signal is surely larger than c, which is a limit value. That is, the voltage of the output amplitude signal never becomes smaller than the limit value c. Further, the voltage of the output amplitude signal gently changes according to the change of the voltage of the input amplitude signal when the voltage of the input amplitude signal stays at a section between zero to b.

That is, when the amplitude signals are waveform-shaped by the amplitude control means 11 of the first embodiment, from among the amplitude signals 5, though the intersecting point with the signal which is cut and shaped by the threshold value and the signal which is not cut nor shaped by the threshold value from among the amplitude signals 5 is protruded, the amplitude control means 42 of the third embodiment waveform-shapes this protruded portion so that it becomes round as shown in FIG. 15.

In FIG. 15, in the section where the voltage of the input amplitude signal stays from zero to b, the first order differential coefficient and the second order differential coefficient regarding the voltage of the input amplitude signal of the output amplitude signal never becomes negative, respectively. That is, the relationship of the voltage of the output amplitude signal with the voltage of the input amplitude signal is non-decreasing and becomes a convex function downward.

Figure 16:
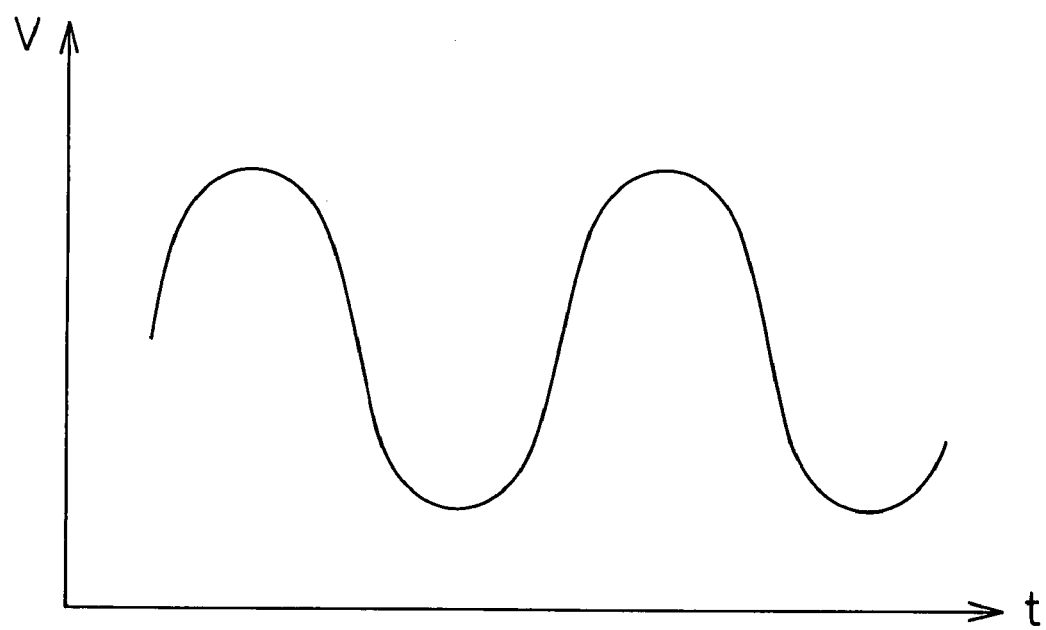
FIG. 16(a) is a view showing a waveform of the amplitude signal before it is waveform shaped by the amplitude control means in the third embodiment of the present invention.
FIG. 16(b) is a view showing the waveform after the amplitude signal shown in FIG. 16(a) is waveform-shaped by the amplitude control means in the third embodiment of the present invention.
Figure 16:
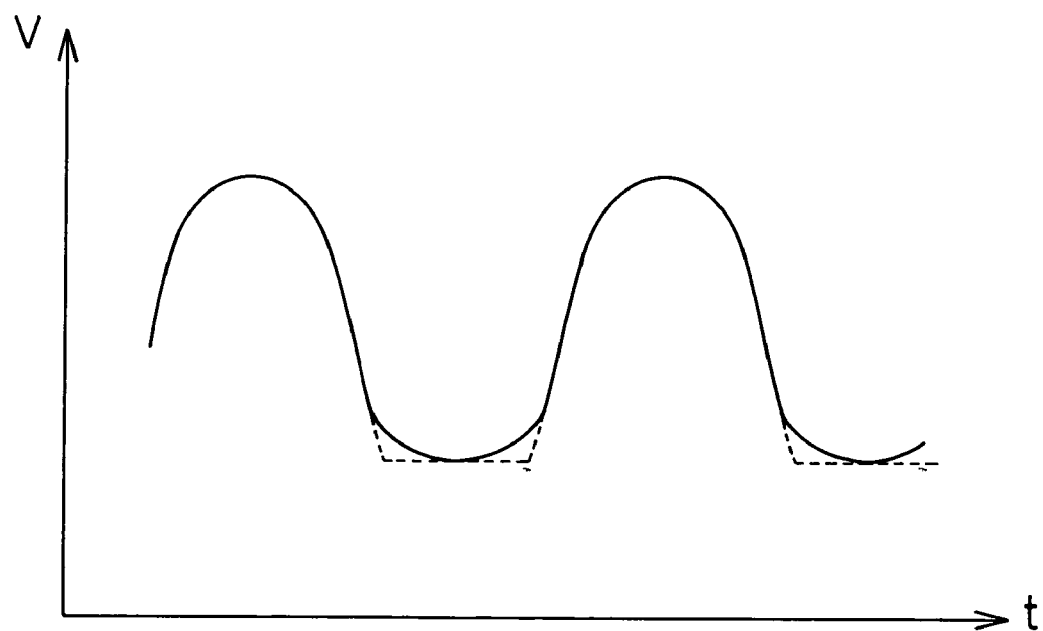

In FIG. 16(*a*) is shown the waveform of the amplitude signal 5 to be inputted to the amplitude control means 42. Further, in FIG. 16(*b*) is shown the waveform after the amplitude control means 42 waveform-shapes the amplitude signal 5 of the FIG. 16(*a*). In FIG. 16(*b*) is shown the waveform after waveform-shaped by the amplitude control means 42 by a solid line, for comparison sake, and is shown a portion different with the portion waveform-shaped by the amplitude control means 42 by a broken line from among the waveforms after waveform-shaped by the amplitude control means 11 of the first embodiment. As evident from FIG. 16(*b*), the waveform shape performed by the amplitude control means 42 of the third embodiment rather than the waveform shape performed by the amplitude control means 11 of the first embodiment has the protruded portion reduced and has the waveform rounded.

The amplitude control means 42 converts a data, which waveform-shapes the amplitude signal 5 to be inputted as described above, further into an analogue signal by a digital/analogue converter owned by the amplitude control means 42, and after that, the data is outputted to the voltage control circuit 3.

The amplitude modulator 4 amplitude-modulates the signal which is angle-modulated by an angle modulator 2 by the signal from the output of the voltage control circuit 3. The signal from the output of the amplitude modulator 4 is outputted from a terminal 10 as the signal polar-modulated.

Since the amplitude control means 42 performs the waveform shape so that the protruded portion is reduced and the waveform becomes round, the frequency distribution of the power spectrum of the output amplitude signal after being waveform-shaped by the amplitude control means 42 has a range narrower than the frequency distribution of the power spectrum of the output amplitude signal after being waveform-shaped by the amplitude control means 11 of the first embodiment. Consequently, the signal polar-modulated which is outputted from the output terminal 10 has the distribution range of the power spectrum narrower comparing to the first embodiment. That is, the modulation control device 41 of the third embodiment can output the signal polar-modulated which is narrower in the frequency distribution range of the output signal comparing to the first embodiment.

Further, the performing of the waveform shaping by the characteristics such as shown in FIG. 15 can be easily realized if the amplitude control means 42 uses a table showing a correspondence relationship between the voltage of the input amplitude signal and the voltage of the output amplitude signal, converts the voltage of the input amplitude signal into the voltage of the output amplitude signal. The table may be located within the amplitude control means 42, or may be located outside the amplitude control means 42.

Figure 14:
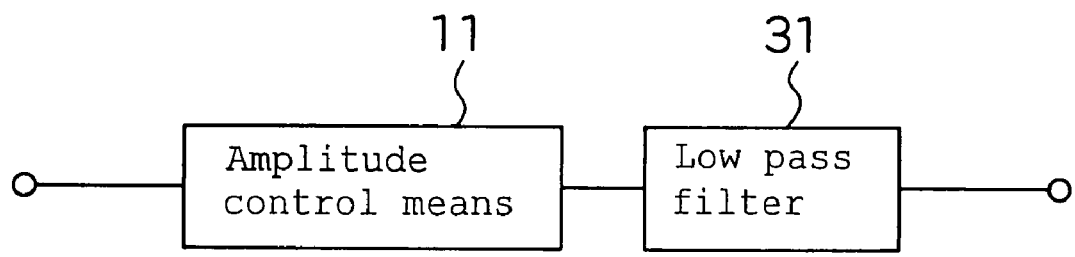
FIG. 14 is a view showing another constitution of the modulation circuit device in the third embodiment of the present invention.

Note that, though the explanation was made that the amplitude control means 42 of the third embodiment can realize the conversion of the voltage of the input amplitude signal into the voltage of the output amplitude signal by using the table showing the correspondence relationship between the voltage of the input amplitude signal and the voltage of the output amplitude signal, it is not limited to this. The conversion can be also realized by using the amplitude control means 42 of the third embodiment in the same way as shown by FIG. 14. That is, in FIG. 14, the amplitude control means 42 is constituted in such a way as to have a low pass filter 31 connected to the output side of the amplitude control means 11 of the first embodiment. In this way, even by connecting the low pass filter 31 to the output side of the amplitude control means 11 of the first embodiment, the amplitude control means 42 of the third embodiment can be realized.

Next, in the case of using the amplitude control means 11 of the first embodiment and the amplitude control means 42 of the third embodiment, respective power spectrums are found and compared by a simulation.

First, the characteristic of the amplitude control means used for the simulation will be described.

Figure 17:
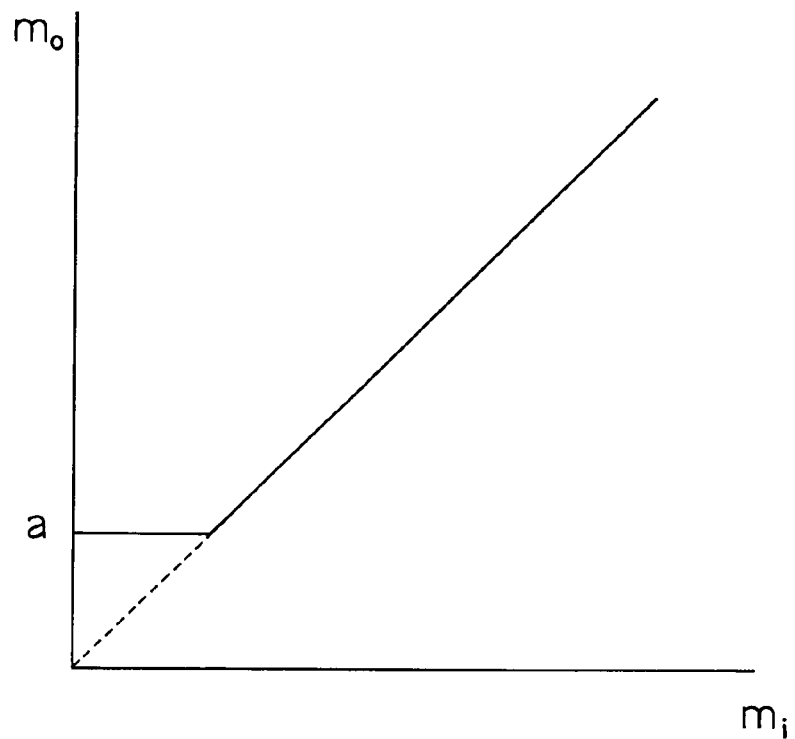
FIG. 17 is a characteristic diagram showing the relationship between the input amplitude signal and the output amplitude signal of the amplitude control means used in a simulation in the third embodiment of the present invention.

FIG. 17 is a view showing the relationship between an input amplitude signal $m_i$ and an output amplitude signal $m_O$. The characteristic of FIG. 17 is equivalent to the characteristic of the amplitude control means 11 of the first embodiment. That is, the voltage $m_i$ of the input amplitude signal and the voltage $m_O$ of the output amplitude signal have the relationship of the following Equation 1.

$m_O = m_i$, (in the case of $m_i \geq a$)

$m_O = a$, (in the case of $m_i < a$)  (Equation 1)

In FIG. 17, when the voltage $m_i$ of the input amplitude signal is below the threshold value a, the voltage $m_O$ of the output amplitude signal becomes a, and when the voltage $m_i$ of the input amplitude signal is more than the threshold value a, the voltage $m_O$ of the output amplitude signal becomes $m_i$. Consequently, the amplitude control means 11 having the characteristic of the FIG. 17 realizes the waveform shaping in such a way as to have the intersecting point protruded with the intersecting point with the portion which is cut and shaped by the threshold value and the portion which is not cut nor shaped by the threshold value.

Figure 18:
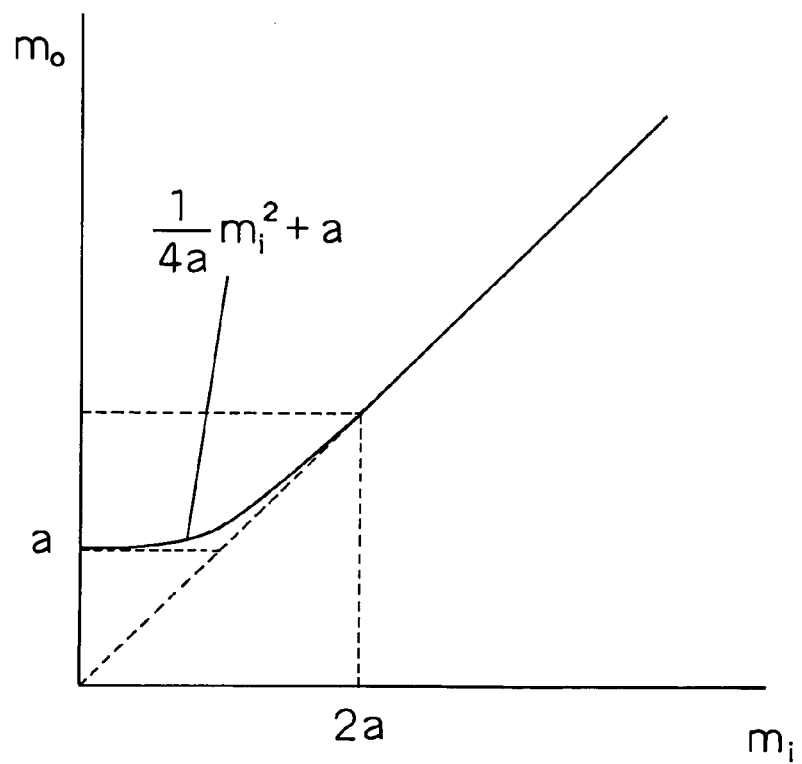
FIG. 18 is a characteristic diagram showing the relationship between the input amplitude signal and the output amplitude signal of the amplitude control means used in the simulation in the third embodiment of the present invention.

The characteristic of FIG. 18 is a view showing the relationship between the voltage $m_i$ of the input amplitude signal and the voltage $m_O$ of the output amplitude signal. The characteristic of FIG. 18 is equivalent to the characteristic of the amplitude control means 42 of the third embodiment.

That is, the voltage $m_i$ of the input amplitude signal and the voltage $m_O$ of the output amplitude signal have the relationship of the following Equation 2.

$m_O = m_i$, (in the case of $m_i \geq 2a$)

$m_O = (1/(4a)) \cdot m_i^2 + a$, (in the case of $m_i < 2a$)  (Equation 2)

In FIG. 18, when the voltage $m_i$ of the input amplitude signal is more than 2a, the voltage $m_O$ of the output amplitude signal becomes $m_i$, and when the voltage $m_i$ of the input amplitude signal is below 2a, the voltage $m_O$ of the output amplitude signal becomes $(1/(4a)) \cdot m_i^2 + a$. The curve of FIG. 18 satisfies the condition that, when the voltage $m_i$ of the input amplitude signal is 0, the voltage $m_O$ of the output amplitude signal is a, and when the voltage $m_i$ of the input amplitude signal=2a, the first order differential coefficient regarding the voltage $m_i$ of the input amplitude signal of the voltage $m_O$ of the output amplitude signal is 1. Consequently, the amplitude control means 42 having the characteristic of FIG. 18 realizes the waveform shaping in such a way as to make round the intersecting point with the signal which is cut and shaped by the threshold value and the signal which is not cut nor shaped by the threshold value.

Figure 19:
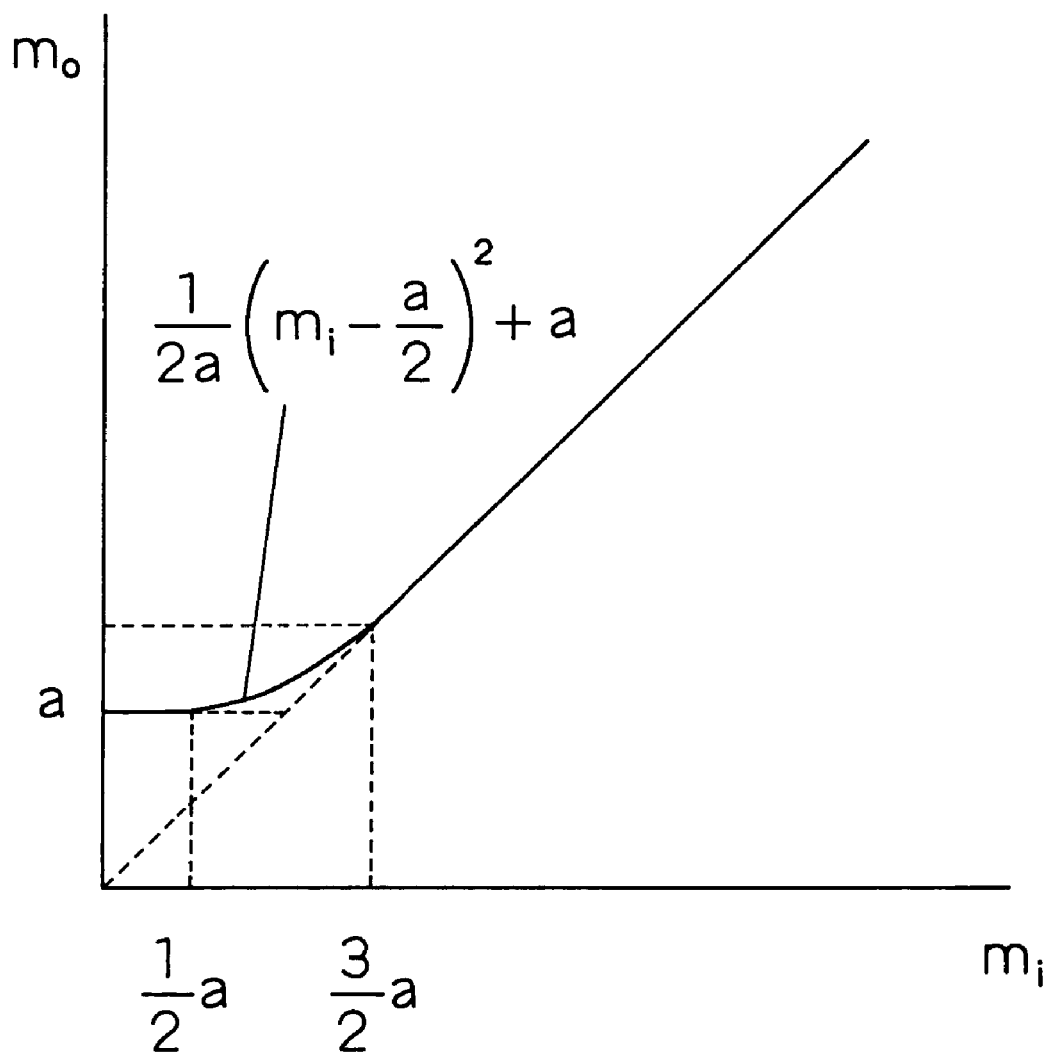
FIG. 19 is a characteristic diagram showing the relationship between the input amplitude signal and the output amplitude signal of the amplitude control means used in the simulation in the third embodiment of the present invention.

FIG. 19 is a view showing the relationship between the input amplitude signal $m_i$ and the output amplitude signal $m_O$. The characteristic of FIG. 19 is equivalent to the characteristic of the amplitude control means 42, which is different from the third embodiment of FIG. 18. That is, the voltage $m_i$ of the input amplitude signal and the voltage $m_O$ of the output amplitude signal have the relationship of the following Equation 3.

$m_O = m_i$, (in the case of $m_i \geq (3/2)a$)

$m_O = (1/(2a)) \cdot (m_i - a/2)^2 + a$, (in the case of $a/2 \leq m_i < (3a/2)$)

$m_O = a$, (in the case of $m_i < a/2$)  (Equation 3)

In FIG. 19, when the voltage $m_i$ of the input amplitude signal is $m_i \leq (3/2)a$, the voltage $m_O$ of the output amplitude signal becomes $m_i$, and when the voltage $m_i$ of the input amplitude signal is in the range satisfying $a/2 \leq m_i < (3a)/2$, the voltage $m_O$ of the output amplitude signal becomes $(1/(2a)) \cdot (m_i - a/2)^2 + a$, and when the voltage $m_i$ of the input amplitude signal is $m_i < a/2$, the voltage $m_O$ of the output amplitude signal becomes a. The amplitude control means 42 having the characteristic of FIG. 19 satisfies the condition that when $m_i = 0$, $m_O = a$, and when $m_i = a/2$, the first order differential coefficient regarding the input amplitude signal $m_i$ of the voltage $m_O$ of the output amplitude signal is zero, and when $m_i = (3a)/2$, the first order differential coefficient regarding the input amplitude signal $m_i$ of the voltage $m_O$ of the output amplitude signal is 1. Consequently, the amplitude control means 42 having the characteristic of FIG. 19 realizes the waveform shaping in such a way to make round the intersecting point with the portion which is cut and shaped by the threshold value and the portion which is not cut nor shaped by the threshold value.

FIG. 20(a) shows a waveform of the amplitude signal before and after the amplitude control by the amplitude control means 11 when the amplitude control means 11 having the characteristic of FIG. 17 is used. Further, FIG. 20(b) shows the power spectrum of the amplitude signal before inputted to the amplitude control means 11 in case of using the amplitude control means 11 having the characteristic of FIG. 17. Further, FIG. 20(c) shows the power spectrum of the amplitude signal outputted and waveform-controlled from the amplitude control means 11 in case of using the amplitude control means 11 having the characteristic of FIG. 17. Further, FIG. 20(d) shows the power spectrum of the output signal from the output terminal 10 of the modulation circuit device 1 of the first embodiment in case of using the amplitude control means 11 having the characteristic of FIG. 17.

Note that, as the simulation condition, the condition of a modulating wave is the same as the condition used in FIG. 11 in the first embodiment. Further, the threshold value, that is, the value of FIG. 17 and a of the Equation 1 are taken as −8 decibel.

When the amplitude control means 11 having the characteristic of FIG. 17 is used, the ACP becomes −53.8 dBc at 50 KHz detuning, −56.8 dBc at 100 KHz detuning, and −68.8 dBc at 200 KHz detuning. Further, the EVM becomes 0.18% at rms (root mean square).

Figure 21A:
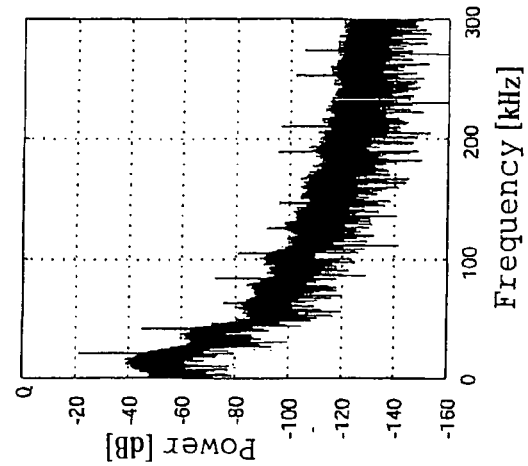
FIG. 21(a) is a view showing the waveform of the amplitude signal before amplitude control and after amplitude control by the amplitude control means in case of using the amplitude control means having a characteristic of FIG. 18.
Figure 21B:
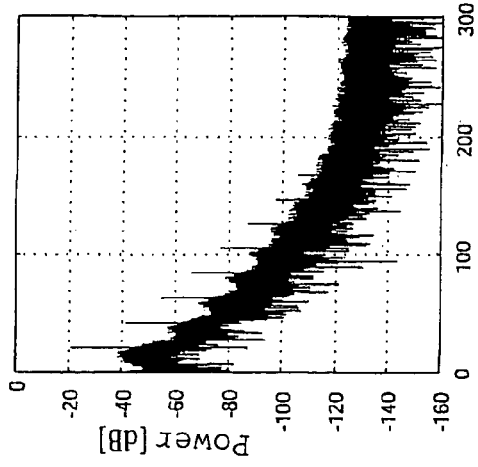
FIG. 21(b) is a view showing a power spectrum of the amplitude signal before it is inputted to the amplitude control means in case of using the amplitude control means having a characteristic of FIG. 18.
Figure 21C:
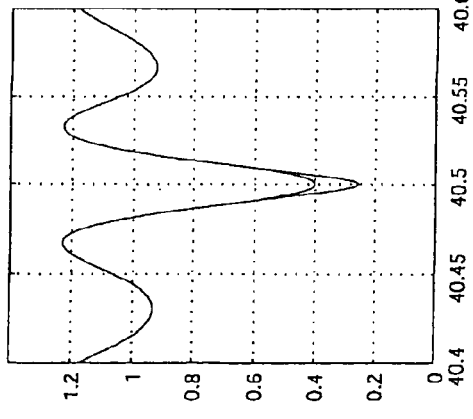
FIG. 21(c) is a view showing the power spectrum of the amplitude signal outputted and waveform-controlled from the amplitude control means in case of using the amplitude control means having a characteristic of FIG. 18.
Figure 21D:
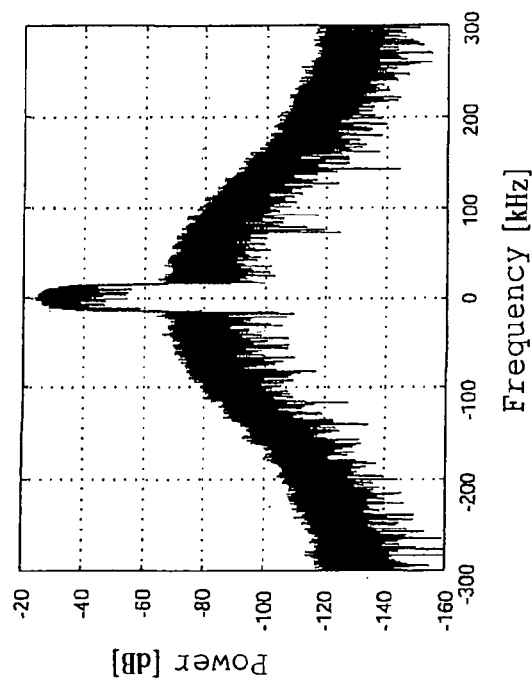
FIG. 21(d) is a view showing the power spectrum of the output signal from the output terminal of the modulation circuit device of the third embodiment in case of using the amplitude control means having a characteristic of FIG. 18.

FIG. 21(a) shows the waveform of the amplitude signal before and after the amplitude control by the amplitude control means 42 in case of using the amplitude control means 42 having the characteristic of FIG. 18. Further, FIG. 21(b) shows the power spectrum of the amplitude signal before inputted to the amplitude control means 42 in case of using the amplitude control means 42 having the characteristic of FIG. 18. Further, FIG. 21(c) shows the power spectrum of the amplitude signal outputted and waveform-controlled from the amplitude control means 42 in case of using the amplitude control means 42 having the characteristic of FIG. 18. Further, FIG. 21(d) shows the power spectrum of the output signal from the output terminal 10 of the modulation circuit device 41 of the third embodiment in case of using the amplitude control means 42 having the characteristic of FIG. 18.

Note that, as the simulation condition, the condition of a modulating wave is the same as the condition used in FIG. 11 in the first embodiment. Further, the limit value, that is, the values of FIG. 19 and a of the Equation 2 are taken as −8 decibel.

When the amplitude control means 42 having the characteristic of FIG. 18 is used, the ACP becomes −45.4 dBc at 50 KHz detuning, −54.4 dBc at 100 KHz detuning, and −82.0 dBc at 200 KHz detuning. Further, the EVM becomes 0.56% at rms.

FIG. 22(a) shows the waveform of the amplitude signal before and after the amplitude control by the amplitude control means 42 in case of using the amplitude control means 42 having the characteristic of FIG. 19. Further, FIG. 22(b) shows the power spectrum of the amplitude signal before being inputted to the amplitude control means 42 in case of using the amplitude control means 42 having the characteristic of FIG. 19. Further, FIG. 22(c) shows the power spectrum of the amplitude signal outputted and waveform-controlled from the amplitude control means 42 in case of using the amplitude control means 42 having the characteristic of FIG. 19. Further, FIG. 22(d) shows the power spectrum of the output signal from the output terminal 10 of the modulation circuit device 41 of the third embodiment in case of using the amplitude control means 42 having the characteristic of FIG. 19.

Note that, as the simulation condition, the condition of a modulating wave is the same as the condition used in FIG. 11 in the first embodiment. Further, the threshold value, that is, the values of FIG. 20 and a of the Equation 3 are taken as −8 decibel.

When the amplitude control means 42 having the characteristic of FIG. 19 is used, the ACP becomes −48.2 dBc at 50 KHz detuning, −54.5 dBc at 100 kHz detuning, and −79.7 dBc at 200 KHz detuning. Further, the EVM becomes 0.38% at rms.

Figure 22:
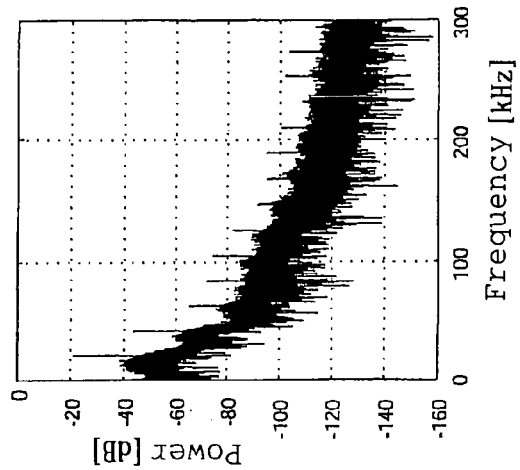
FIG. 22(a) is a view showing a power spectrum of the amplitude signal before the amplitude control and after the amplitude control by the amplitude control means in case of using the amplitude control means having a characteristic of FIG. 19.
FIG. 22(b) is a view showing a power spectrum of the amplitude signal before it is inputted to the amplitude control means in case of using the amplitude control means having a characteristic of FIG. 19.
FIG. 22(c) is a view showing the power spectrum of the amplitude signal outputted and waveform-controlled from the amplitude control means in case of using the amplitude control means having a characteristic of FIG. 19.
FIG. 22(d) is a view showing the power spectrum of the output power from the output terminal of the modulation circuit device of the third embodiment in case of using the amplitude control means having a characteristic of FIG. 19.
Figure 22:
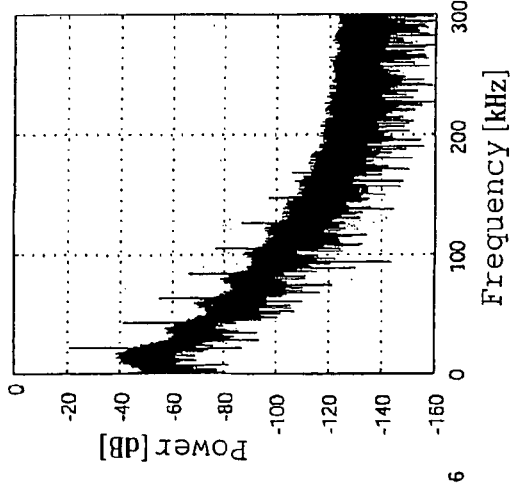
Figure 22:
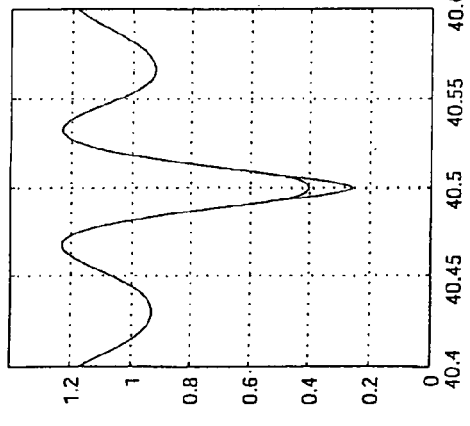
Figure 22:
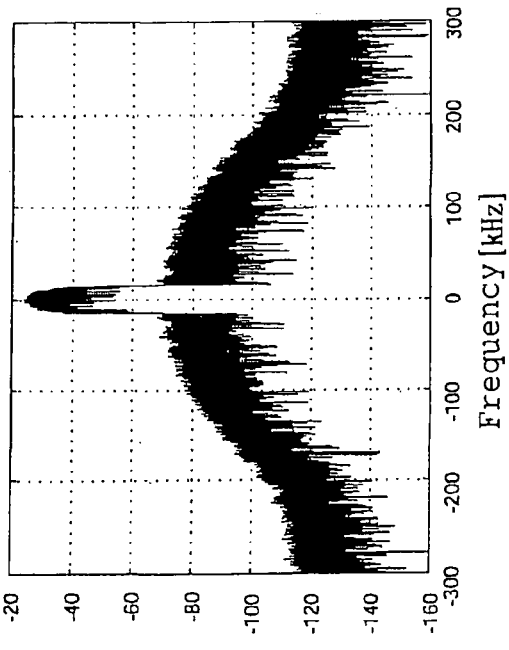

Comparing the simulation results among FIGS. 20, 21 and 22, when the amplitude control means 42 having the characteristic of FIG. 21, that is, FIG. 18 is used, comparing to the case of using the amplitude control means 11 having the characteristic of FIG. 20, that is, FIG. 17, though the distortion in the center vicinity of the transmission frequency is deteriorated, the distortion at the place away from the center of the transmission frequency is improved. Further, when the amplitude control means 42 having the characteristic of FIG. 22, that is, FIG. 19 is used, the intermediate result between FIG. 20 and FIG. 21 is shown.

Note that, as the amplitude control means 42, it is not limited to those having the characteristics of FIGS. 15, 18 and 19 nor is it limited to those having the characteristics of the subsequent FIGS. 23 to 28.

Figure 23:
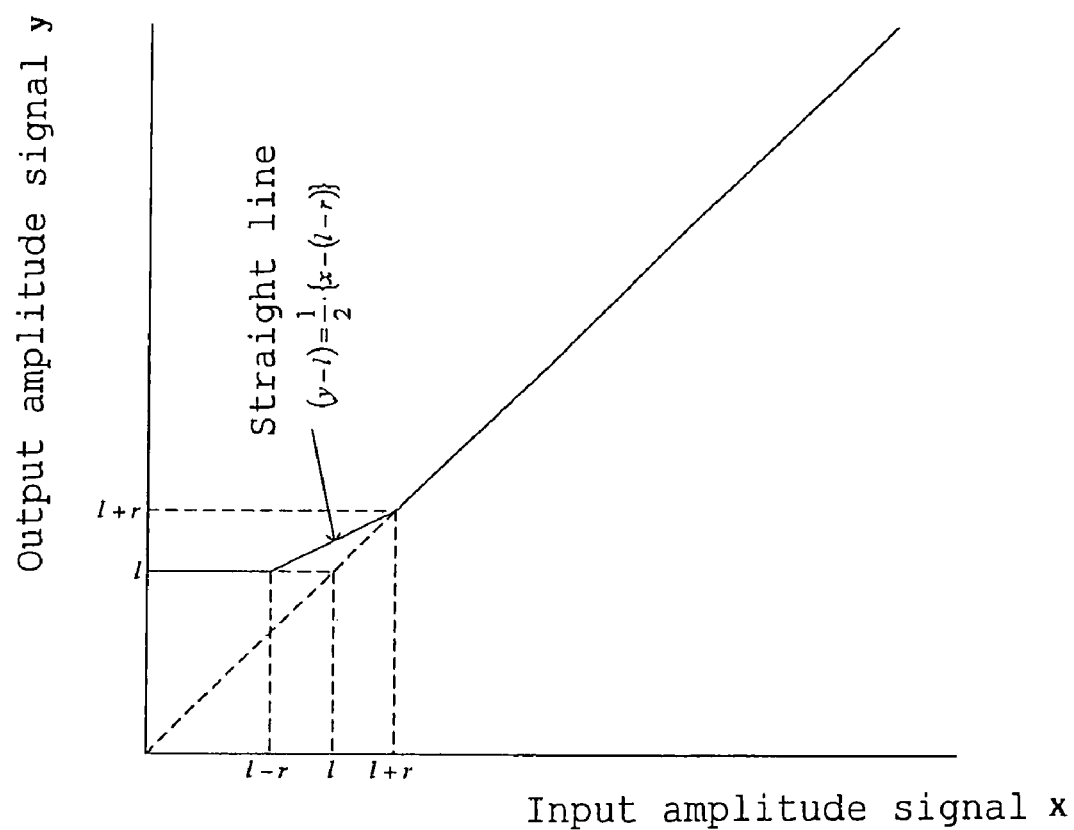
FIG. 23 is a characteristic diagram showing the relationship between the input amplitude signal and the output amplitude signal of the amplitude control means of the third embodiment of the present invention.

That is, FIG. 23 is a view showing the relationship between the voltage of the input amplitude signal and the voltage of the output amplitude signal in the amplitude control means 42. In FIG. 23, the axis x which is an axis of abscissas shows the voltage of the input amplitude signal, and the axis y which is a longitudinal axis shows the voltage of the output amplitude signal.

In FIG. 23, when the voltage of the input amplitude signal is below 1, the voltage of the output amplitude signal becomes 1, and when the voltage of the input amplitude signal stays at the section from 1−r to 1+r, the voltage of the output amplitude signal becomes a straight line $(y-1)=(1/2)\cdot\{x-(1-r)\}$, and when the voltage of the input amplitude signal becomes more than 1+r, the voltage of the input amplitude signal and the voltage of the output amplitude signal become equal.

Even when the amplitude control means 42 converts the voltage of the input amplitude signal into the voltage of the output amplitude signal as shown in FIG. 23, the amplitude circuit device 41 of the third embodiment can output the signal polar-modulated in such a way not to widen the frequency range distribution of the output signal.

Figure 24:
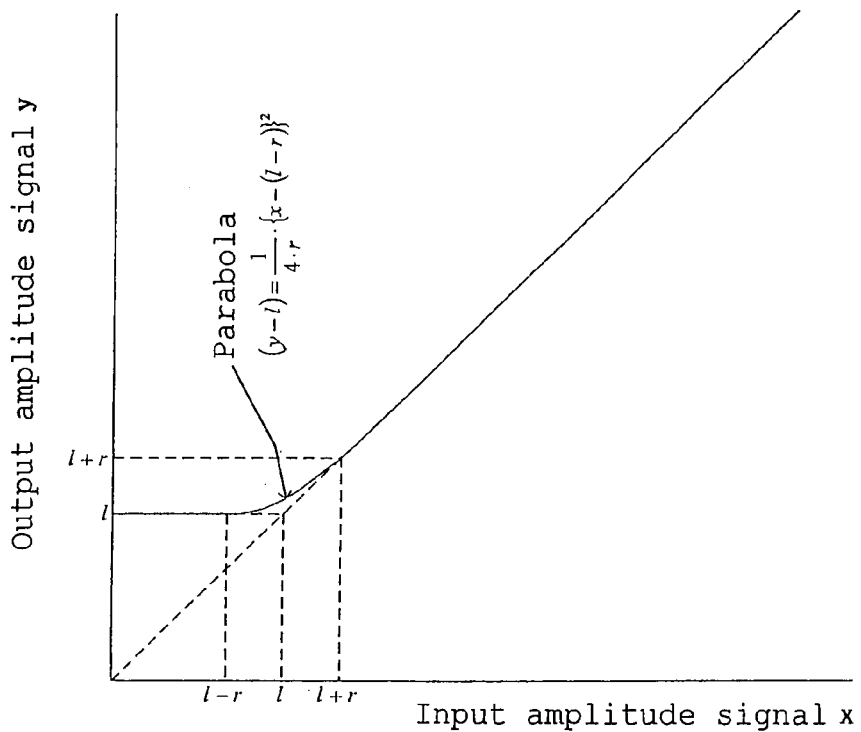
FIG. 24 is a characteristic diagram showing the relationship between the input amplitude signal and the output amplitude signal of the amplitude control means of the third embodiment of the present invention.

Further, FIG. 24 is a view different from the above view which shows the relation ship between the voltage of the input amplitude signal and the voltage of the output amplitude signal in the amplitude control means 42. In FIG. 24, the axis x which is an axis of abscissas shows the voltage of the input amplitude signal, and the axis y which is a longitudinal axis shows the voltage of the output amplitude signal.

In FIG. 24, when the voltage of the input amplitude signal is below 1−r, the voltage of the output amplitude signal becomes 1, and when the voltage of the input amplitude signal stays at the section from 1−r to 1+r, the voltage of the output amplitude signal becomes a parabola $(y-1)=(1/(4r))\cdot\{x-(1-r)\}^2$, and when the voltage of the input amplitude signal becomes more than 1+r, the voltage of the input amplitude signal and the voltage of the input amplitude signal become equal.

Even when the amplitude control means 42 converts the voltage of the input amplitude signal into the voltage of the output amplitude signal as shown in FIG. 24, the amplitude circuit device 41 of the third embodiment can output the signal polar-modulated in such a way not to widen the frequency range distribution of the output signal.

Figure 25:
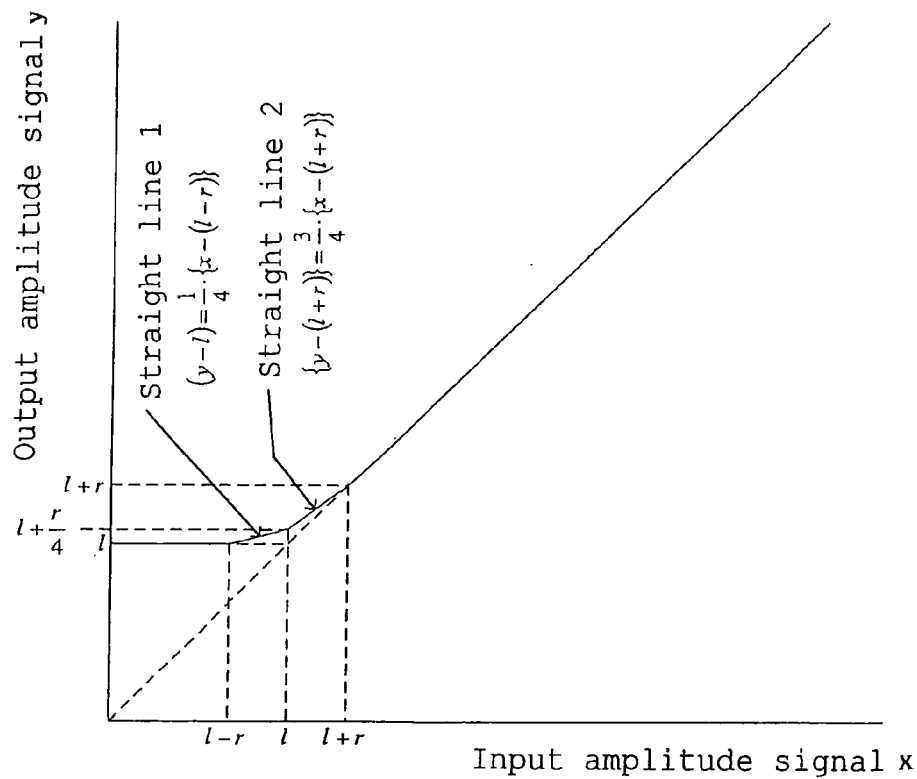
FIG. 25 is a characteristic diagram showing the relationship between the input amplitude signal and the output amplitude signal of the amplitude control means of the third embodiment of the present invention.

Further, FIG. 25 is a view different from the above view which shows the relationship between the voltage of the input amplitude signal and the voltage of the output amplitude signal in the amplitude control means 42. In FIG. 25, the axis x which is an axis of abscissas shows the voltage of the input amplitude signal, and the axis y which is a longitudinal axis shows the voltage of the output amplitude signal.

In FIG. 25, when the voltage of the input amplitude signal is below 1−r, the voltage of the output amplitude signal becomes 1, and when the voltage of the input amplitude signal stays at the section from 1−r to 1, the voltage of the output amplitude signal becomes a straight line 1 which is (y−1)=(¼)·{x−(1−r)}, and when the voltage of the input amplitude signal stays at the section from 1 to 1+r, the voltage of the output amplitude signal is a straight line 2, which is (y−1+r)=(¾)·[x−(1+r)]. and when the voltage of the input amplitude signal is more than 1+r, the voltage of the input amplitude signal and the voltage of the output amplitude signal becomes equal.

Even when the amplitude control means 42 converts the voltage of the input amplitude signal into the voltage of the output amplitude signal as shown in FIG. 25, the amplitude circuit device 41 of the third embodiment can output the signal polar-modulated in such a way not to widen the frequency range distribution of the output signal.

Figure 26:
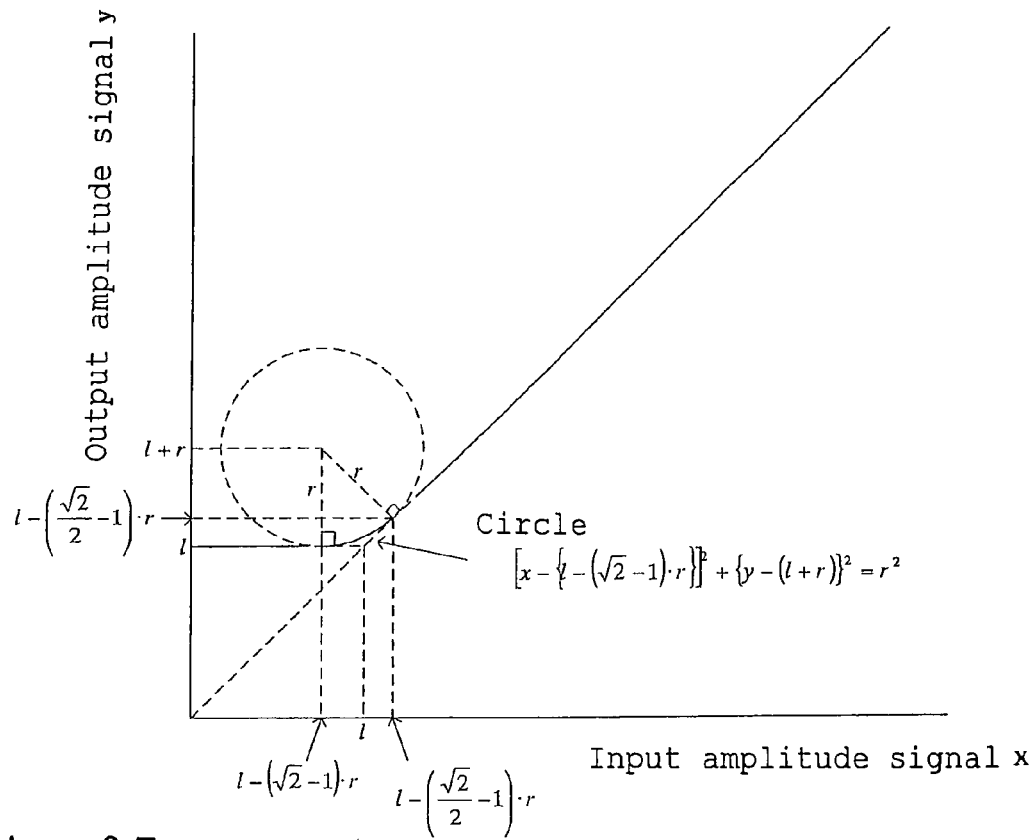
FIG. 26 is a characteristic diagram showing the relationship between the input amplitude signal and the output amplitude signal of the amplitude control means of the third embodiment of the present invention.

Further, FIG. 26 is a view different from the above view which shows the relationship between the voltage of the input amplitude signal and the voltage of the output amplitude signal in the amplitude control means 42. In FIG. 26, the axis x which is an axis of abscissas shows the voltage of the input amplitude signal, and the axis y which is a longitudinal axis shows the voltage of the output amplitude signal.

In FIG. 26, when the voltage of the input amplitude signal is below $1-(2^{1/2}-1)\cdot r$, the voltage of the output amplitude signal becomes 1, and when the voltage of the input amplitude signal stays at the section from $1-((2^{1/2}-1)\cdot r$ to $1-((2^{1/2}/2)-1))$, the voltage of the output amplitude signal becomes a circle $[x-\{1-(2^{1/2}-1)\cdot r\}^2+\{y-(1+r)\}^2=r^2$ and when the voltage of the input amplitude signal becomes more than $1-((2^{1/2}/2)-1)\cdot r$, the voltage of the input amplitude signal and the voltage of the output amplitude signal becomes equal.

Even when the amplitude control means 42 converts the voltage of the input amplitude signal into the voltage of the output amplitude signal as shown in FIG. 26, the amplitude circuit device 41 of the third embodiment can output the signal polar-modulated in such a way not to widen the frequency range distribution of the output signal.

Figure 27:
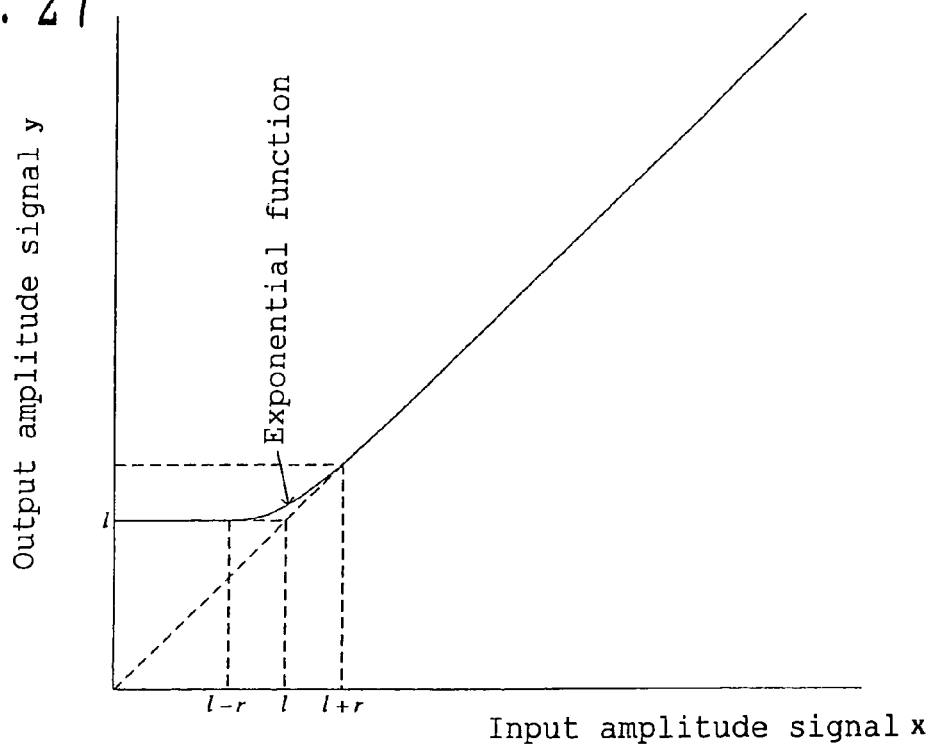
FIG. 27 is a characteristic diagram showing the relationship between the input amplitude signal and the output amplitude signal of the amplitude control means of the third embodiment of the present invention.

Further, FIG. 27 is a view different from the above view which shows the relationship between the voltage of the input amplitude signal and the voltage of the output amplitude signal in the amplitude control means 42. In FIG. 27, the axis x which is an axis of abscissas shows the voltage of the input amplitude signal, and the axis y which is a longitudinal axis shows the voltage of the output amplitude signal.

In FIG. 27, when the voltage of the input amplitude signal is below 1−r, the voltage of the output amplitude signal becomes 1, and when the voltage of the input amplitude signal stays at the section from 1−r to 1+r, the voltage of the output amplitude signal becomes an exponential function, and when the voltage of the input amplitude signal become more than 1+r, the voltage of the input amplitude signal and the voltage of the output amplitude becomes equal.

Even when the amplitude control means 42 converts the voltage of the input amplitude signal into the voltage of the output amplitude signal as shown in FIG. 27, the amplitude circuit device 41 of the third embodiment can output the signal polar-modulated in such a way not to widen the frequency range distribution of the output signal.

Figure 28:
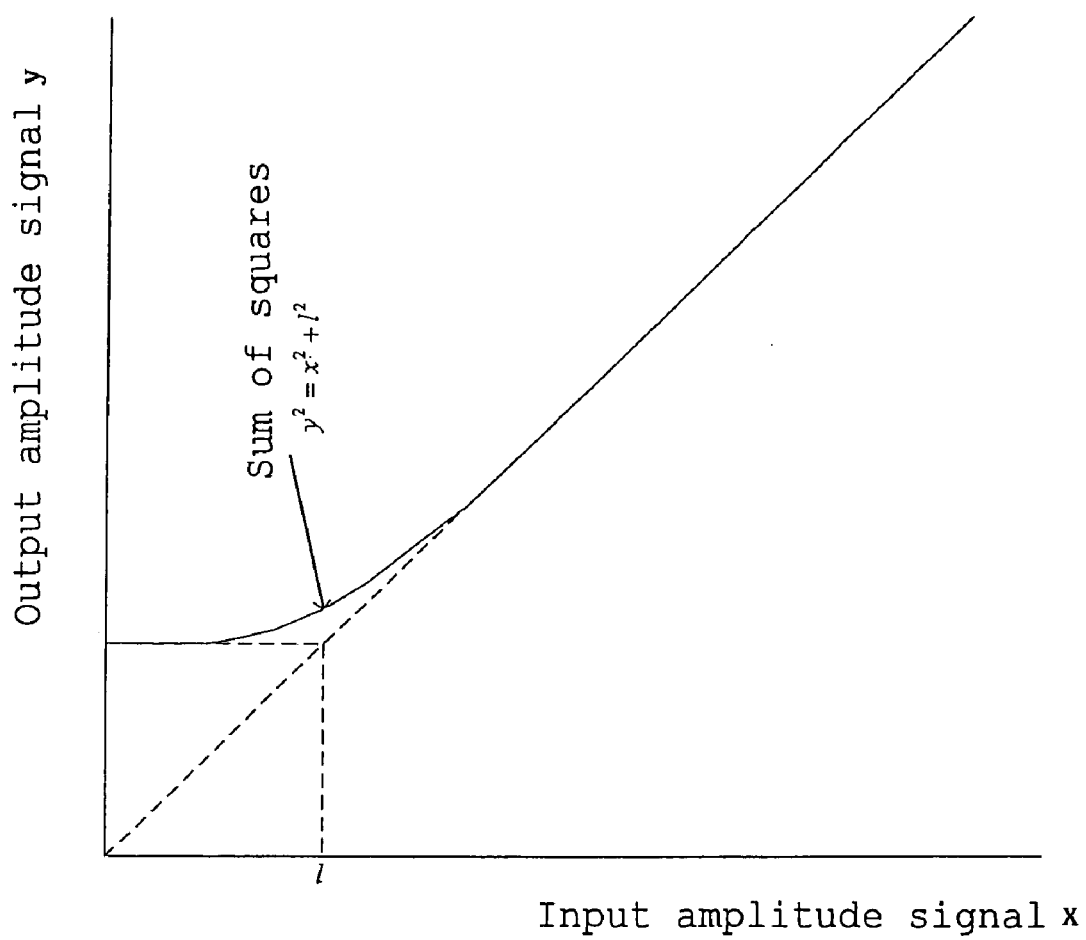
FIG. 28 is a characteristic diagram showing the relationship between the input amplitude signal and the output amplitude signal of the amplitude control means of the third embodiment of the present invention.

Further, FIG. 28 is a view different from the above view which shows the relationship between the voltage of the input amplitude signal and the voltage of the output amplitude signal in the amplitude control means 42. In FIG. 28, the axis x which is an axis of abscissas shows the voltage of the input amplitude signal, and the axis y which is a longitudinal axis shows the voltage of the output amplitude signal.

In FIG. 28, the voltage of the input amplitude signal becomes a sum of square $y^2=x^2+1^2$ in the vicinity of 1 in the voltage of the input amplitude signal. Further, when the voltage of the input amplitude signal is below the vicinity of 1, the voltage of the output amplitude signal become 1, and when the voltage of the input amplitude signal is above the vicinity of 1, the voltage of the input amplitude signal and the voltage of the output amplitude signal becomes equal.

Even when the amplitude control means 42 converts the voltage of the input amplitude signal into the voltage of the output amplitude signal as shown in FIG. 28, the amplitude circuit device 41 of the third embodiment can output the signal polar-modulated in such a way not to widen the frequency range distribution of the output signal.

Further, as described above, FIG. 25 combines two straight lines, and realizes the waveform shaping in such as way as to make round the intersecting point with the portion which is cut and shaped by the threshold value and the portion which is not cut nor shaped by the threshold value from among the amplitude signals 5. Similarly to this, the waveform shaping can be realized in such a way as to combine various straight lines or curved lines such as the straight line of FIG. 23, the parabola of FIG. 24, the circle of FIG. 26, the exponential function of FIG. 27, the sum of square and the like of FIG. 28 in plurality or in plurality of types, respectively, and make round the intersecting point with the portion which is cut and shaped by the threshold value and the portion which is not cut nor shaped by the threshold value from among the amplitude signals 5. Further, the waveform shaping can be realized in such a way as to make round the intersecting point with the portion which is cut and shaped by the threshold value and the portion which is not cut nor shaped by the threshold value even by using a spline function such as a B spline function and a cardinal spline function.

In short, in the vicinity of the intersecting point with the portion which is cut and shaped by the threshold value and the portion which is not cut nor shaped by the threshold value from among the amplitude signals 5, if only the relationship between the voltage of the output amplitude signal and the voltage of the input amplitude signal at this intersecting point comes to be the amplitude control means 42 in such a way that the first order differential coefficient and the second order differential coefficient regarding the voltage of the input amplitude signal of the output amplitude signal does not becomes negative, respectively.

Note that even when the amplitude control means 42 of the third embodiment is used in replacement of the amplitude control means 11 of the amplitude circuit device 12 of FIG. 2, in replacement of the amplitude control means 11 of the modulation circuit device 18 of FIG. 3, or in replacement of the amplitude control means 11 of the modulation circuit device 19 of FIG. 5, the advantage equivalent to the third embodiment can be obtained.

Note that, in the third embodiment, when the voltage of the amplitude signal 5 inputted from the first input terminal 8 becomes lower than the threshold value, though the amplitude control means 42 shapes the waveform of the amplitude signal 5 so that the voltage of the portion which becomes small becomes the threshold value, and at the same time, the intersecting point with the portion which is cut and shaped by the threshold value and the portion which is not cut nor shaped by the threshold value from among the amplitude signals 5 to be inputted is made round and shaped, it is not limited to this. When the voltage of the amplitude signal 5 inputted from the first input terminal 8 becomes higher than the threshold value, the waveform of the amplitude signal 5 is shaped so that the voltage of the amplitude signal 5 of the portion which becomes higher becomes the threshold value, and at the same time, the intersecting point with the portion which is cut and shaped by the threshold value and the portion which is not cut nor shaped by the threshold value from among the amplitude signals 5 to be inputted may be made round and shaped.

In this case, the amplitude control means 42 makes the intersecting point round and shaped so that the first order differential coefficient regarding the voltage of the input amplitude signal of the voltage of the output amplitude signal corresponding to the portion rounded and shaped becomes not negative nor the second order differential coefficient becomes positive. That is, the relationship of the voltage of the output amplitude signal corresponding to the portion rounded and shaped with the voltage of the input amplitude is non-decreasing and becomes a convex function upward.

Figure 29:
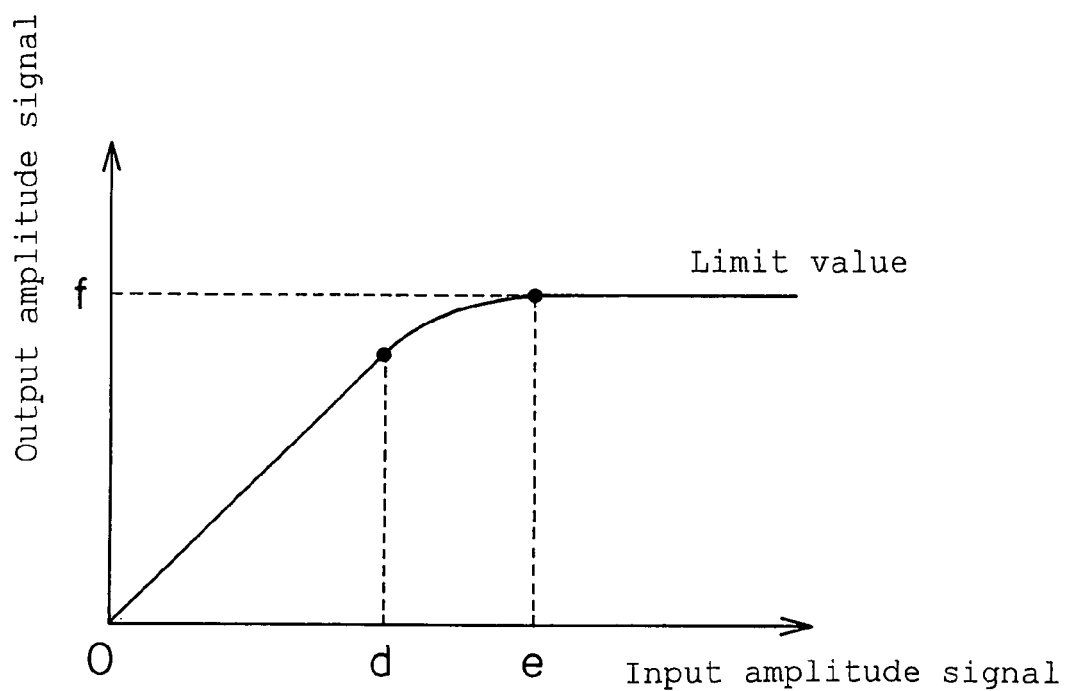
FIG. 29 is a characteristic diagram showing the relationship between the input amplitude signal and the output amplitude signal of the amplitude control means of the third embodiment of the present invention.

In FIG. 29 is shown a characteristic diagram showing such a relationship between the voltage of the input amplitude signal and the voltage of the output amplitude signal of the amplitude control means 42. The portion from d to e of the voltage of the input amplitude signal of the graph of FIG. 29 is equivalent to the portion from o to be of the voltage of the input amplitude signal of the graph of FIG. 15 revolves to 180 degrees, and after that, moves in parallel. Similarly, from among the views showing the characteristics of various amplitude control means 42, a view can be obtained in which, when the voltage of the amplitude signal 5 becomes higher than the threshold value by revolving the portions rounded and shaped 180 degrees and moving them in parallel, the waveform of the amplitude signal 5 is shaped so that the voltage of the amplitude signal 5 of the portion which become high becomes the threshold value, and at the same time, the intersecting point with the portion which is cut and shaped by the threshold value and the portion which is not cut nor shaped by the threshold value from among the amplitude signal 5 to be inputted is rounded and shaped.

Further, when the voltage of the amplitude signal 5 becomes smaller than the first threshold value, the waveform of the amplitude signal is shaped so that the voltage of the amplitude signal 5 of the portion which becomes small becomes the first threshold value. A the same time, the waveform shaping in which the intersecting point with the portion which is cut and shaped by a first threshold value and the portion which is not cut nor shaped by the first threshold value from among the amplitude signals 5 is made round and shaped rounded and shaped, and the waveform shaping in which the intersecting point with the portion which is cut and shaped by the second threshold value and the portion which is not cut nor shaped by the second threshold value from among the amplitude signals 5 is made round and shaped, when the voltage of the amplitude signal 5 becomes higher than the second threshold value which is higher than the first threshold value, the waveform of the amplitude signal is shaped so that the voltage of the amplitude signal 5 of the portion which becomes large becomes the second threshold value, may be performed together by the amplitude control means 42.

Further, in the third embodiment, though the explanation was made that the amplitude control means 42 waveform-shapes the amplitude signal 5 to be inputted by the digital signal processing, it is not limited to this. The amplitude control means 42 may waveform-shape the amplitude signal 5 to be inputted by the analogue signal processing.

In this way, according to the third embodiment, when the amplitude signal is waveform-shaped by the amplitude control means, the intersecting point with the portion which is cut and shaped by the threshold value and the portion which is not cut nor shaped by the threshold value from among the amplitude signals is made round and shaped, so that the frequency distribution range of the output signal is not made wider.

Fourth Embodiment

Next, a fourth embodiment will be described.

In the fourth embodiment, a radio communication device using the modulation circuit device described in the first to third embodiments will be described.

Figure 30:
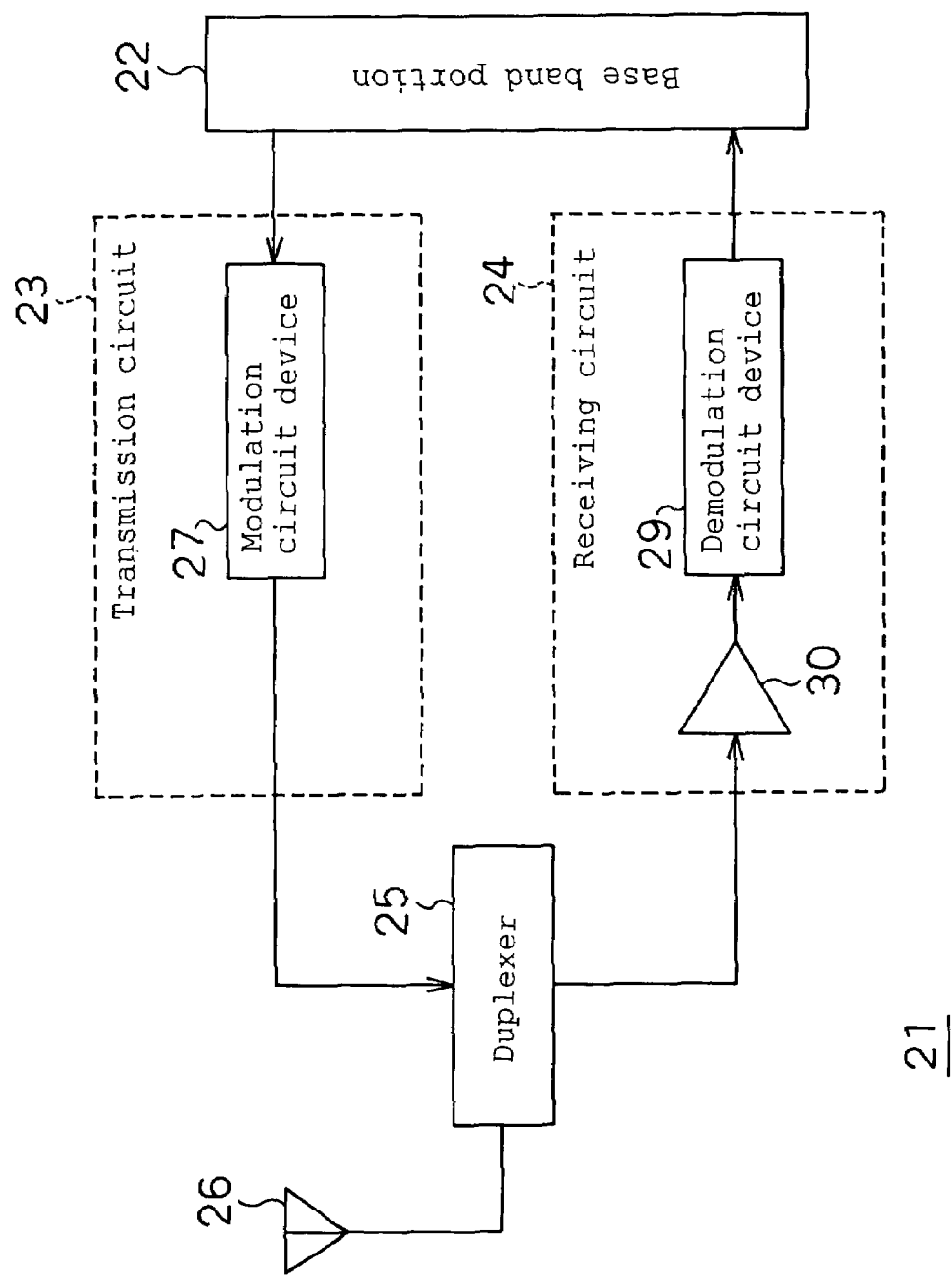
FIG. 30 is a view showing the constitution of a radio communication device in a fourth embodiment of the present invention.
Figure 31:
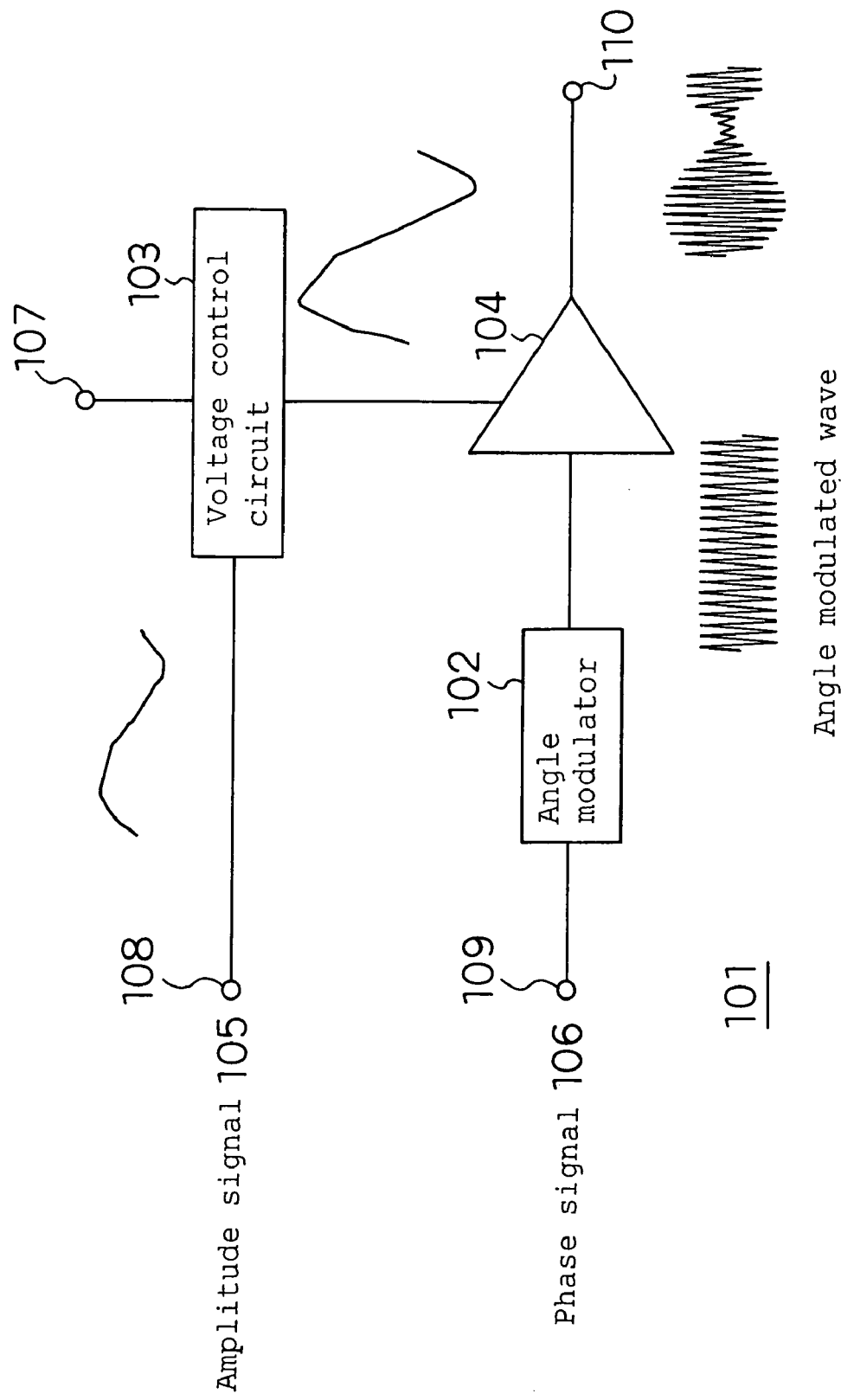
FIG. 31 is a view showing the structure of a conventional modulation circuit device.

In FIG. 30, radio communication device 21 using the modulation circuit devices of the first, second, and third embodiments is shown.

That is, the radio communication device 21 consists of a base band portion 22, a transmission circuit 23, a receiving circuit 24, a duplexer 25, and an antenna 26. Further, the transmission circuit 23 consists of a modulation circuit device 27, and the receiving circuit 24 consists of a demodulator circuit device 29 and a low noise amplifier 30.

The base band portion 22 is means which generates and outputs the amplitude signal 5 and a phase signal 6 for transmission to the transmission circuit 23, and at the same time, inputs the in-phase signal and the quadrature-phase signal for reception, which are demodulated by a demodulation circuit device 29, and restores an audio signal and the like.

The transmission circuit device 23 is a circuit which inputs the amplitude signal 5 and the phase signal 6 outputted for reception from the base band portion 22, and outputs a transmission signal to the duplexer 25.

The receiving circuit 24 is a circuit which inputs a receiving signal from the duplexer 25, and outputs the in-phase signal and the quadrature-phase signal for reception to the base band portion 22.

The duplexer 25 is a circuit which guides a transmission signal outputted from the transmission circuit 23 to the antenna 26, and outputs a receiving signal received from the antenna 26 to the receiving circuit 24. The antenna 26 is means which converts the transmission signal into an electric wave, and at the same time, converts a propagated electric wave into the receiving signal.

Note that, as the modulation circuit device 27, the modulation circuit device described in the first, second and third embodiments is used.

Next, the operation of the present embodiment will be described.

First, the operation at the time when transmission is performed will be described.

The base band portion 22 generates the amplitude signal 5 and the phase signal 6 from the audio signal and the like, and outputs them to the modulation circuit device 27.

The modulation circuit device 27 inputs the amplitude signal 5 and the phase signal 6, and performs the polar modulation as described in the first, second and third embodiments.

The duplexer 25 guides the transmission signal outputted from the modulation circuit device 27 to the antenna 26, and the antenna 26 converts the transmission signal guided from the duplexer 25 into an electric wave.

Next, the operation at a reception time will be described.

The antenna 26 receives an electric wave, and converts it into a receiving signal, and the duplexer 25 guides the received signal to a low noise amplifier 30.

The low noise amplifier 30 amplifies the received signal, and outputs it to the demodulator circuit device 29.

The demodulator circuit device 29 demodulates the signal outputted from the low noise amplifier 30, and outputs the in-phase signal and the quadrature-phase signal to the base band portion 22.

The base band portion 22 restores the audio signal and the like from the in-phase signal and the quadrature-phase signal outputted from the demodulator circuit device 29.

In this way, since the radio communication device 21 of the fourth embodiment uses the modulation circuit device described in the first, second and third embodiments as the modulation circuit device 27 of the transmission circuit device 23, the same advantage as the first, second and third embodiments can be obtained.

The present invention can provide a modulation circuit device, a modulation method and a radio communication device, which can obtain a desired signal even when a transistor used as the amplitude modulator of the modulator to perform a polar-modulation is a transistor not having a linearity in the wide range.

Further, the prevent invention can provide a modulation circuit device, a modulation method and a radio communication device which can obtain a desired signal by using a single transistor or without becoming complicated when a plurality of transistors is used by the modulator for performing the polar modulation.

The modulation circuit device, the modulation method and the radio communication device according to the present invention have the advantage capable of obtaining a desired signal even if the transistor used as the amplitude modulator of the modulator to perform polar-modulation is a transistor having no linearity in a wider rang, and are useful for the modulation circuit device used in the transmission circuit device such as the mobile phone and the like, and particularly for the modulation circuit device to polar-modulate the input signal, the modulation method and the radio communication device using the same.

Further, the modulation circuit device, the modulation method and the radio communication device according to the present invention have the advantage capable of obtaining a desired signal when a single transistor or a plurality of transistors are used without a control becoming complicated, and are useful for the modulation circuit device used in the transmission circuit device such as the mobile phone and the like, and particularly for the modulation circuit device to perform polar modulation, the modulation method and the radio communication device using the same.

What is claimed is:

1. A modulation circuit device, comprising:
an angle modulator of angle-modulating a phase signal to be inputted;
a waveform shaping means in which, (1) when the magnitude of an amplitude signal to be inputted becomes smaller than a first prescribed value, a waveform of said amplitude signal is shaped so that the magnitude of said amplitude signal of the portion which becomes small becomes said first prescribed value, and/or (2) when the magnitude of said amplitude signal to be inputted becomes larger than said second prescribed value which is larger than said first prescribed value, the waveform of said amplitude signal is shaped so that the magnitude of said amplitude signal of the portion which becomes larger becomes said second prescribed value;
a direct current voltage supply circuit of supplying a direct current voltage;
a first amplitude modulator which operates on either of the operation modes of a first operation mode for amplifying the signal from the output of said angle modulator and a second operation mode for amplitude modulating the signal of the output of said angle modulator by the signal of the output of said waveform shaping means; and
a second amplitude modulator which operates on either of the operation modes of a first operation mode for amplifying the output of said first amplitude modulator and a second operation mode for amplitude-modulating the signal of the output of said first amplitude modulator by the signal of the output of said waveform shaping means;
wherein, when an output is made larger than a prescribed value by an output power, said first amplitude modulator is operated on said first operation mode with the signal from the output of said direct current voltage supply circuit controlled to be inputted, and said second amplitude modulator is operated on the second operation mode with the signal of the output of said waveform shaping means controlled to be inputted,
wherein, when an output is made by an output power smaller than a prescribed value, said first amplitude modulator is operated on said second operation mode with the signal from the output of said waveform shaping means controlled to be inputted, and said second amplitude modulator is operated on the first operation mode with the signal of the output of said direct current voltage supply circuit controlled to be inputted.

2. A modulation circuit device, comprising:
an angle modulator of angle-modulating a phase signal to be inputted;
waveform shaping means in which, (1) when the magnitude of an amplitude signal to be inputted becomes smaller than a first prescribed value, a waveform of said amplitude signal is shaped so that the magnitude of said amplitude signal of the portion which becomes small becomes said first prescribed value, and/or (2) when the magnitude of said amplitude signal to be inputted becomes larger than said first prescribed value which is larger than said second prescribed value, the waveform of said amplitude signal is shaped so that the magnitude of said amplitude signal of the portion which becomes larger becomes said second prescribed threshold value;
a direct current voltage supply circuit of supplying a direct current voltage;
a first amplitude modulator which operates on either of the operation modes of a first operation mode for amplifying the signal from the output of said angle modulator and a second operation mode for amplitude-modulating the signal of the output of said angle modulator by the signal of the output of said waveform shaping means; and a second amplitude modulator of amplitude-modulating the signal of the output of said first amplitude modulator by the signal of the output of said waveform shaping means;

wherein, when an output is made larger than a prescribed value by an output power, said first amplitude modulator is operated on said first operation mode with the signal from the output of said direct current voltage supply circuit controlled to be inputted, and said second amplitude-modulator amplitude modulates the signal of the output of said first amplitude modulator by the signal of the output of said waveform shaping means with the signal of the output of said waveform shaping means controlled to be inputted, and the signal of the output of said second amplitude modulator is outputted outside, wherein, when an output is made smaller than a prescribed value by an output power, said first amplitude modulator is operated on the second operation mode with the signal from the output of said waveform shaping means controlled to be inputted, and the signal of the output of said first amplitude modulator is outputted outside.

3. The modulation circuit device according to claim 1 or 2, wherein said voltage control circuit changes said direct current according the magnitude of an output power.

4. The modulation circuit device according to claim 1 or 2, wherein said waveform shaping means comprises:
   amplitude control means of shaping the waveform of said amplitude signal; and
   a voltage control circuit of generating an output signal based on the signal of the output of said amplitude control means.

5. The modulation circuit device according to claim 4, wherein a diode is used for said amplitude control means.

6. The modulation circuit device according to claim 4, wherein a series regulator is used for said voltage control circuit.

7. The modulation circuit device according to claim 4, wherein a switching regulator is used for said voltage control circuit.

8. The modulation circuit device according to claim 4, wherein said voltage control circuit serves as said amplitude control means,
   wherein said voltage control circuit comprises a function to shape the waveform of said amplitude signal so as to meet the characteristic of said amplitude modulator.

9. The modulation circuit device according to claim 1 or 2, wherein said waveform shaping means comprises:
   a voltage control circuit of amplifying said amplitude signal to be inputted; and
   amplitude control means of shaping the waveform of the signal of the output of said voltage control circuit.

10. The modulation circuit device according to claim 9, wherein a diode is used for said amplitude control means.

11. The modulation circuit device according to claim 9, wherein a series regulator is used for said voltage control circuit.

12. The modulation circuit device according to claim 9, wherein a switching regulator is used for said voltage control circuit.

13. The modulation circuit device according to claim 9, wherein said voltage control circuit serves as said amplitude control means,
   wherein said voltage control circuit comprises a function to shape the waveform of said amplitude signal so as to meet the characteristic of said amplitude modulator.

14. The modulation circuit device according to claim 1 or 2, (1) wherein the waveform shaping means shapes to round out an intersecting point with a portion which is cut and shaped by said first prescribed value and a portion which is not cut nor shaped by said first prescribed value from among said amplitude signals to be inputted, (2) and/or wherein the waveform shaping means and shapes to round out an intersecting point with a portion which is cut and shaped by said second prescribed value and a portion which is not cut nor shaped by said second prescribed value from among said amplitude signals to be inputted.

15. The modulation circuit device according to claim 14, wherein (1) from among the magnitude of said amplitude signals to be inputted, said waveform shaping means makes said intersecting point round and shaped so that the first order differential coefficient and the second order differential coefficient involved with the magnitude of said amplitude signals to be inputted of the magnitude of said signal from the output of said waveform shaping means corresponding to the portion made round and shaped of the side relating to said first prescribed value does not become negative, respectively, and/or wherein(2), from among the magnitude of said amplitude signals to be inputted, said waveform shaping means makes said intersecting point round and shaped, so that the first order differential coefficient involved with the magnitude of said amplitude signals to be inputted of the magnitude of said signal of the output of said waveform shaping means corresponding to the portion to be made round and shaped relating to said second prescribed value does not become negative nor the second order differential coefficient becomes positive.

16. The modulation circuit device according to claim 14, wherein said waveform shaping means shapes the waveform of said amplitude signal to be inputted by using a table which allows the input signal to correspond to the output signal.

17. A radio communication device, comprising:
   a transmission circuit of outputting a transmission signal; and
   a receiving circuit of inputting a receiving signal, wherein the modulation circuit device according to claim 1 or 2 is used for said transmission circuit.

18. A modulation method, comprising:
   an angle modulation step of angle modulating a phase signal to be inputted by an angle modulator,
   a waveform shaping step, in which (1), when the magnitude of an amplitude signal to be inputted becomes smaller than the first prescribed value, the waveform of said amplitude signal is shaped so that the magnitude of said amplitude signal of the portion which becomes small becomes said first prescribed value, (2) and/or when the magnitude of said amplitude signal to be inputted becomes larger than a second prescribed value which is larger than a first prescribed value, the waveform of the said amplitude signal is shaped so that the magnitude of said amplitude signal of the portion which becomes large becomes said second prescribed value;
   a direct current voltage supply step of supplying a direct current voltage by a direct current voltage supply circuit;
   a first amplitude modulation step which operates a first amplitude modulator on either of the operation modes of a first operation mode for amplifying the signal from the output of said angle modulator or a second operation mode for amplitude modulating the signal of the output of said angle modulator by the signal of the output of said waveform shaping means; and a second amplitude modulation step which operates a second amplitude modulator on either of the operation modes of a first operation mode for amplifying the signal from the output of said first amplitude modulator or a second operation mode for amplitude modulating the signal of the output of said first amplitude modulator by the signal of the output of said waveform shaping means;

wherein, when an output is made larger than a prescribed value by an output power, said first amplitude modulator is operated on said first operation mode with the signal from the output of said direct current voltage supply circuit controlled to be inputted, and said second amplitude modulator is operated on the second operation mode with the signal of the output of said waveform shaping means controlled to be inputted, wherein, when an output is made smaller than a prescribed value by an output power, said first amplitude modulator is operated on said second operation mode with the signal from the output of said waveform shaping means controlled to be inputted, and said second amplitude modulator is operated on the first operation mode with the signal of the output of said direct current voltage supply circuit controlled to be inputted.

19. A modulation method, comprising:

an angle modulation step of angle-modulating a phase signal to be inputted by an angle modulator;

a waveform shaping step, in which, (1) when the magnitude of an amplitude signal to be inputted becomes smaller than said first prescribed value, the waveform of said amplitude signal is shaped by the waveform shaping means so that the magnitude of said amplitude signal of the portion which becomes small becomes said first prescribed value, (2) and/or, when the magnitude of said amplitude signal to be inputted becomes larger than a second prescribed value which is larger than a first prescribed value, the waveform of said amplitude signal is shaped shaping so that said amplitude signal of the portion which becomes large becomes said second prescribed value;

a direct current voltage supply step of supplying a direct current voltage by a direct current supply circuit;

a first amplitude modulation step which operates a first amplitude modulator on either of the operation modes of a first operation mode for amplifying the signal from the output of said angle modulator or a second operation mode for amplitude modulating the signal of the output of said waveform shaping means by the signal of the output of said waveform shaping means; and a second amplitude modulation step which causes a second amplitude modulator to amplitude modulate the signal of the output of said first amplitude modulator by the signal of the output of said waveform shaping means, wherein, when an output is made larger than a prescribed value by an output power, said first amplitude modulator is operated on said first operation mode with the signal from the output of said direct current voltage supply circuit controlled to be inputted, and said second amplitude modulator is controlled to be inputted with the signal of the output of said waveform shaping means, so that the signal from the output of said first amplitude modulator is amplitude-modulated by the signal of the output of said waveform shaping means, and the signal of the output of said second amplitude modulator is outputted outside, wherein, when an output is made smaller than a prescribed value by an output power, said first amplitude modulator is operated on said second operation mode with the signal from the output of said waveform shaping means controlled to be inputted, and the signal of the output of said first amplitude modulator is outputted outside.

20. The modulation method according to claim 18 or 19, (1) wherein the waveform shaping step makes round and shapes an intersecting point with a portion which is cut and shaped by said first prescribed value and a portion which is not cut nor shaped by said first prescribed value from among said amplitude signals to be inputted, (2) and/or wherein the waveform shaping step makes round and shapes an intersecting point with a portion which is cut and shaped by said second prescribed value and a portion which is not cut nor shaped by said second prescribed value from among said amplitude signals to be inputted.

21. The modulation method according to claim 20, wherein (1) from among the magnitude of said amplitude signals to be inputted, said waveform shaping step makes said intersecting point round and shaped so that the first order differential coefficient and the second order differential coefficient involved with the magnitude of said amplitude signals to be inputted of the magnitude of said signal from the output of said waveform shaping means corresponding to the portion made round and shaped of the side related to said first prescribed value does not become negative, respectively, and/or wherein (2), from the magnitude of among said amplitude signals to be inputted, said waveform shaping means makes said intersecting point round and shaped, so that the first order differential coefficient involved with the magnitude of said amplitude signals to be inputted of the magnitude of said signal of the output of said waveform shaping means corresponding to the portion to be made round and shaped related to said second prescribed value does not become negative and the second order differential coefficient does not become positive.

* * * * *